(12) United States Patent
Tagami et al.

(10) Patent No.: US 6,538,324 B1
(45) Date of Patent: Mar. 25, 2003

(54) MULTI-LAYERED WIRING LAYER AND METHOD OF FABRICATING THE SAME

(75) Inventors: Masayoshi Tagami, Tokyo (JP); Yoshihiro Hayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/596,415

(22) Filed: Jun. 19, 2000

(30) Foreign Application Priority Data

Jun. 24, 1999 (JP) .............................. 11-214110

(51) Int. Cl.[7] .......................... H01L 23/48; H01L 23/52
(52) U.S. Cl. ....................................... 257/751; 257/762
(58) Field of Search ............................ 257/751, 752, 257/753, 758, 762, 773; 438/626, 627, 628, 643, 644, 645

(56) References Cited

U.S. PATENT DOCUMENTS

| 5,668,411 A | * | 9/1997 | Hong et al. ................. 257/751 |
| 5,858,873 A | * | 1/1999 | Vitkavage et al. .......... 438/626 |

FOREIGN PATENT DOCUMENTS

| JP | 8-139092 | | 5/1996 |
| JP | 8-274098 | | 10/1996 |
| JP | 9-64044 | | 3/1997 |
| JP | 9-293690 | * | 11/1997 |
| JP | 10-256256 | | 9/1998 |

OTHER PUBLICATIONS

Semiconductor World Nobuyoshi Awaya, Feb. 1998, pp. 91–96.

Kee–Won Kwon et al., "Characteristics of Ta As An Underlayer for Cu Interconnects", Advanced Metallization and Interconnect Systems for ULSIApplications in 1997, 1998, pp. 711–716.

M. T. Wang, et al., "Barrier Properties of Very Thin Ta and TaN Layers Against Copper Diffusion", Journal Electrochemical Society, Jul. 1998, pp. 2538–2545.

D. Denning, et al., An Inlaid CVD Cu Based Integration for Sub $0.25\mu m$ Technology, 1998 Symposium on VLSI Technology Digest of Technical Papers, 1998, pp. 22–23.

* cited by examiner

Primary Examiner—Tom Thomas
Assistant Examiner—Hung Kim Vu
(74) Attorney, Agent, or Firm—Scully, Scott, Murphy & Presser

(57) ABSTRACT

There is provided a barrier film preventing diffusion of copper from a copper wiring layer formed on a semiconductor substrate. The barrier film has a multi-layered structure of first and second films wherein the first film is composed of crystalline metal containing nitrogen therein, and the second film is composed of amorphous metal nitride. The barrier film is constituted of common metal atomic species. The barrier film prevents copper diffusion from a copper wiring layer into a semiconductor device, and has sufficient adhesion characteristic to both a copper film and an interlayer insulating film.

10 Claims, 20 Drawing Sheets

MULTI-LAYERED WIRING LAYER AND METHOD OF FABRICATING THE SAME

BACKGROUND OF THE INVENTION

1. Field of the Invention

The invention relates to a semiconductor integrated circuit including a copper wiring layer, and more particularly to a barrier film which prevents copper diffusion from such a copper wiring layer.

2. Description of the Related Art

As a semiconductor device has been designed to be smaller and smaller in size, wiring delay exerts greater influence on a silicon ULSI device. As a result, though a wiring layer has been composed of aluminum, it is necessary to compose a wiring layer of copper in place of aluminum.

Resistivity of copper is equal to about 70% of resistivity of aluminum. However, since copper does not form passive state composed of an oxide film, at a surface thereof, unlike aluminum, copper is more corrosive than aluminum.

In addition, since copper has a high diffusion rate in both silicon (Si) and silicon dioxide ($SiO_2$), if copper enters MOSFET formed on a silicon substrate, copper would induce reduction in carrier lifetime.

Hence, it is absolutely necessary for a semiconductor device having a copper wiring layer to have a diffusion-barrier film for preventing diffusion of copper into an interlayer insulating film formed between copper wiring layers. In addition, since such a diffusion-barrier film has to have high adhesion characteristic to both an interlayer insulating film and a copper wiring layer in order to keep reliability in wiring.

Thus, there have been made many suggestions about a structure of a barrier metal layer and a method of fabricating the same, in order to prevent copper diffusion form a copper wiring layer.

For instance, a structure of a barrier metal layer is suggested in the following articles:

(a) Semiconductor World, Nobuyoshi Awaya, February 1998, pp. 91–96 (hereinafter, referred to as Prior Art 1);

(b) Advanced Metallization and Interconnect Systems for ULSI Applications in 1997, Kee-Won Kwon et al., 1998, pp. 711–716 (hereinafter, referred to Prior Art 2);

(c) Journal Electrochemical Society, M. T. Wang et al., July 1998, pp. 2538–2545 (hereinafter, referred to as Prior Art 3); and (d) 1998 Symposium on VLSI Technology Digest of Technical Papers, D. Denning et al., 1998, pp. 22–23.

In addition, a structure of a barrier metal layer and a method of fabricating the same both for preventing copper diffusion is suggested also in Japanese Unexamined Patent Publications 8-139092, 8-274098, 9-64044 and 10-256256, and Japanese Patent Application No. 10-330938. Herein, Japanese Patent Application No. 10-330938 is not published yet, and hence does not constitute prior art to the present invention. However, it is explained in the specification only for better understanding of the present invention. The applicant does not admit that Japanese Patent Application No. 10-330938 constitutes prior art to the present invention.

It is quite difficult to dry-etch copper, and hence, a copper wiring layer is formed generally by chemical mechanical polishing (CMP).

Specifically, a copper wiring layer is formed as follows.

An insulating film is formed on an underlying copper wiring layer. Then, the insulating film is formed with a recess and a through-hole reaching the underlying copper wiring layer. Then, a thin diffusion-barrier film is formed on surfaces of the recess and the through-hole therewith such that the recess and the through-hole is completely covered at surfaces thereof with the diffusion-barrier film in order to prevent copper diffusion from uncovered region.

Thereafter, a copper film is deposited filling the recess and the through-hole therewith by CVD or sputtering. Then, the copper film and the diffusion-barrier film are removed in selected regions by CMP. Thus, a copper wiring layer is completed.

As will be obvious to those skilled in the art, the diffusion-barrier film is required to have high coverage as well as capability of preventing copper diffusion and adhesion to copper.

The diffusion-barrier film is composed, for instance, of refractive metal such as tungsten (W), tantalum (Ta) or titanium (Ti), or nitride of such refractive metal such as tungsten nitride (WN), titanium nitride (TiN) or tantalum nitride (TaN).

As explained in Prior Art 2, for instance, a tantalum (Ta) barrier film has high adhesion with a copper film formed on the tantalum barrier film by sputtering, ensuring improvement in crystallinity of the copper film. However, since copper is diffused into the tantalum film, it would be necessary for the tantalum barrier film formed below the copper film, to have a thickness of 50 nm or greater.

Prior Art 4 reports that if a copper film is formed on a tantalum film by CVD, fluorine (F) segregates at an interface between the copper film and TaN, resulting in degradation in adhesion therebetween.

Prior Art 3 reports that a crystalline TaN barrier film oriented in directions of (200) and (111) can prevent copper diffusion more highly than a crystalline Ta barrier film.

As an solution to enhance a characteristic of preventing copper diffusion and adhesion to copper, a multi-layered structure of a metal film and a metal nitride film has been suggested.

For instance, the above-mentioned Japanese Patent Application No. 10-330938 has suggested a method of fabricating a multi-layered barrier film including a titanium film and formed by sputtering.

As illustrated in FIG. 1, in accordance with the suggested method, only an argon gas is introduced into a sputter chamber to thereby form a titanium film 1. Then, a nitrogen gas is introduced into the sputter chamber, and a thin titanium nitride film 2 is formed on the titanium film 1 auxiliarily making use of reaction between titanium and nitrogen. Thus, there is formed a multi-layered barrier structure 3 comprised of the titanium film 1 and the thin titanium nitride film 2.

In the method, a metal oxide film formed on an underlying wiring film is removed by argon plasma prior to carrying out sputtering.

However, the conventional barrier film for preventing copper diffusion is accompanied with the following problems.

The first problem is that it is quite difficult to make a diffusion-barrier film have both a characteristic of preventing copper diffusion and a sufficient adhesive force with copper.

As illustrated in FIG. 2, it is now assumed to form a metal film 5 having a crystallized pillar structure, on a semiconductor substrate 4. In the metal film 5, a lot of grains each comprised of individual crystals, and grain boundaries 7 each defining an interface between the grains 6 exist throughout the metal film 5, that is, from an upper surface to a bottom of the metal film 5. The grain boundaries 7 define paths 8 through which copper is diffused. As a result, the metal film 5 has low barrier characteristic of preventing copper diffusion.

As illustrated in FIG. 3, it is now assumed to form a metal film 5a on a semiconductor substrate 4. If the metal film 5a is composed of metals having small resistivity, such as tungsten (W), titanium (Ti) or tantalum (Ta), the metal film 5 would have a polycrystal structure. As a result, the metal film 5a would have a pillar-like structure similarly to the metal film 5 illustrated in FIG. 2, and accordingly, the metal film 5a would have small barrier characteristic of preventing copper diffusion.

However, it should be noted that if a copper film is formed on a crystalline metal film, such as a β-Ta (002) film as obtained in sputtering of a tantalum film, by sputtering, the copper film would have high adhesion and rich crystal orientation, though a barrier characteristic of preventing copper diffusion would be deteriorated. As a result, the copper film would enhance reliability in copper wiring.

In contrast, the metal film 5a illustrated in FIG. 3, which is composed of particles 9 such as amorphous TaN and formed on the semiconductor substrate 4, has small resistivity, specifically in the range of about 200 to 250 $\mu\Omega$cm, and does not have the paths through which copper is diffused unlike the crystalline metal film 5 illustrated in FIG. 2. As a result, the metal film 5a would have high barrier characteristic of preventing copper diffusion.

However, since a surface of the metal film 5a is amorphous and hence crystal lattice is not uniformly arranged, if a copper film s formed on the amorphous metal film 5a by CVD or sputtering, copper crystallinity and adhesion to copper are degraded.

As mentioned so far, it is quite difficult to form a diffusion-barrier film having a single-layered structure comprised only of a crystalline metal film or an amorphous metal nitride film, and further having high barrier characteristic of preventing copper diffusion and high adhesion to copper.

The second problem is caused when a diffusion-barrier film is designed to have a multi-layered structure in order to avoid the above-mentioned problem of the single-layered diffusion-barrier film.

For instance, if a diffusion-barrier film is designed to have a multi-layered structure comprised of a crystalline metal film having high adhesion to copper and an amorphous metal nitride film having high barrier characteristic, such as TaN, there would be obtained a diffusion-barrier film having high barrier characteristic of preventing copper diffusion and high adhesion to copper.

However, since it was not possible in a conventional method to successively form a crystalline metal film and an amorphous metal nitride film by sputtering, the crystalline metal film and the amorphous metal nitride film had to be separately formed in the same sputtering chamber or be formed in separate sputtering chambers.

For instance, the above-mentioned Japanese Patent Application No. 10-330938 has suggested a method including the steps of introducing an argon gas into a sputtering chamber to thereby form a titanium film, and introducing a nitrogen gas into the sputtering chamber to thereby form a titanium nitride film on the titanium film.

However, in accordance with this method, the titanium nitride film cannot be formed until partial pressures of argon and nitrogen become stable by varying a mixture ratio of argon and nitrogen. Hence, it is impossible to enhance a fabrication yield of fabricating a diffusion-barrier film having a multi-layered structure.

The third problem relates to coverage of a film formed by sputtering.

In general, when a metal film or a metal nitride film is formed by sputtering, a metal target is sputtered by argon plasma generated by virtue of rotational magnetic field and application of DC bias, and resultingly, a metal film or a metal nitride film is deposited on a substrate located in facing relation to the metal target.

In sputtering, a pressure at which a metal target is sputtered is low, specifically, equal to 1 Pa or smaller. Since metal particles sputtered by argon plasma are radiated randomly to a surface of a substrate, for instance, if the substrate is formed at a surface thereof with a deep recess or hole, it would almost impossible to deposit a metal film such that such a recess or hole is completely covered with the metal film.

In addition, since a sputtering pressure is low, argon plasma could have a low plasma density, and hence, there cannot be expected re-sputtering effect in which a metal film deposited onto a surface of a substrate is sputtered by argon plasma.

In order to enhance coverage of a metal film, there has been suggested collimate sputtering in which a metal plate formed with a lot of through-holes is located between a sputtering target and a substrate, and metal particles are caused to pass through the through-holes to thereby uniform direction of metal particles. In accordance with the collimate sputtering, it is possible to deposit a metal film on a bottom of a recess formed at a surface of a substrate, but it is not possible to deposit a metal film onto an inner sidewall of the recess.

The fourth problem is that a crystalline metal film having high adhesion with a copper film tends to react with atmosphere to thereby a reaction layer at a surface thereof.

Such a reaction layer would much deteriorate adhesion of a metal film with a copper film.

The fifth problem is a copper oxide film is adhered again to a recess or hole.

An oxide film formed on a surface of an underlying wiring metal film is removed by argon plasma prior to deposition of a diffusion-barrier film by sputtering. When an underlying wiring layer is composed of copper, a copper oxide film is scattered by argon sputtering, and as a result, the thus scattered copper oxide is adhered again to a recess or hole formed at a surface of an insulating film.

The sixth problem is that when a copper film is formed on a tantalum film and an amorphous TaN film by CVD, adhesion between the copper film and a diffusion-barrier film is deteriorated.

SUMMARY OF THE INVENTION

In view of the above-mentioned problems in a conventional diffusion-barrier film, it is an object of the present invention to provide a diffusion-barrier film having both a diffusion-barrier characteristic of preventing copper from being diffused into a semiconductor device and high adhesion between a copper film and an interlayer insulating film.

It is also an object of the present invention to provide a multi-layered wiring structure including the above-mentioned diffusion-barrier film.

Another object of the present invention is to provide a method of fabricating such the above-mentioned diffusion-barrier film.

A further object of the present invention is to provide a method of fabricating a multi-layered copper wiring layer in which copper is buried above the above-mentioned diffusion-barrier film.

In one aspect of the present invention, there is provided a barrier film preventing diffusion of copper from a copper wiring layer formed on a semiconductor substrate, including a multi-layered structure of first and second films, the first film being composed of crystalline metal containing nitrogen therein, the second film being composed of amorphous metal nitride, the barrier film being constituted of common metal atomic species.

It is preferable that the first film is formed on the second film.

It is preferable that the second film has a thickness in the range of 80 angstroms to 150 angstroms both inclusive.

It is preferable that the first film has a thickness in the range of 60 angstroms to 300 angstroms both inclusive.

In another aspect of the present invention, there is provided a multi-layered wiring structure including a barrier film which prevents diffusion of copper from a copper wiring layer formed on a semiconductor substrate, the barrier film having a multi-layered structure of first and second films, the first film being composed of crystalline metal containing nitrogen therein, the second film being composed of amorphous metal nitride, the barrier film being constituted of common metal atomic species.

It is preferable that the barrier film covers a recess and a hole formed throughout an insulating film formed on an underlying wiring layer.

It is preferable that the multi-layered wiring structure further includes a copper film formed on the first film.

In still another aspect of the present invention, there is provided a method of forming a diffusion-barrier film by sputtering, including the steps of (a) preparing gas containing nitrogen therein, and (b) varying only power of an electric power source for generating plasma to thereby successively form a diffusion-barrier film having a multi-layered structure of first and second films, the first film being composed of crystalline metal containing nitrogen therein, the second film being composed of amorphous metal nitride, the barrier film being constituted of metal atomic species of sputter target.

It is preferable that the gas containing nitrogen therein has a pressure equal to or greater than 5 Pa.

It is preferable that the gas contains nitrogen at 10 volume % or smaller.

It is preferable that the metal atomic species of sputter target is one of tantalum, tungsten, titanium, molybdenum and niobium alone or in combination.

It is preferable that the second film has a thickness in the range of 80 angstroms to 150 angstroms both inclusive.

It is preferable that the first film has a thickness in the range of 60 angstroms to 300 angstroms both inclusive.

There is further provided a method of forming a diffusion-barrier film by RF magnetron sputtering making use of rotational magnetic field and RF power, including the steps of (a) preparing gas containing nitrogen therein, and (b) varying the RF power to thereby successively form a diffusion-barrier film having a multi-layered structure of first and second films, the first film being composed of crystalline metal containing nitrogen therein, the second film being composed of amorphous metal nitride, the barrier film being constituted of metal atomic species of sputter target.

There is still further provided a method of forming a diffusion-barrier film by RF magnetron sputtering, including the steps of (a) setting an electric power source for generation plasma to generate power having a first value, to thereby a first film, with a concentration of nitrogen in plasma gas being kept at a constant, and (b) setting the electric power source to generate power having a second value greater than the first value at the moment when the first film is formed by a predetermined thickness, to thereby form a second film on the first film.

It is preferable that the first film is composed of amorphous metal nitride, and the second film is composed of crystalline metal containing nitrogen therein.

There is yet further provided a method of forming a copper wiring film, including the steps of (a) radiating plasma of argon containing hydrogen therein, to a recess or hole formed at an insulating film formed on a semiconductor substrate, (b) forming a diffusion-barrier film to cover the recess or hole therewith without exposing to atmosphere, the diffusion-barrier film having a multi-layered structure of first and second films, the first film being composed of crystalline metal containing nitrogen therein, the second film being composed of amorphous metal nitride, and (c) forming a copper film on the diffusion-barrier film without exposing to atmosphere.

It is preferable that the diffusion-barrier film is formed by sputtering.

It is preferable that the copper film is formed in vacuum.

It is preferable that the copper film is formed by thermal chemical vapor deposition in which thermal dismutation in a complex of organic metal is utilized.

It is preferable that the copper film is formed by sputtering in which copper target is used.

The advantages obtained by the aforementioned present invention will be described hereinbelow.

In the diffusion-barrier film in accordance with the present invention, a copper film makes direct contact with a crystalline metal film containing nitrogen therein, ensuring high adhesion therebetween and high crystallinity of a copper film.

In addition, since the metal film contains nitrogen therein, copper diffusion into a semiconductor device can be prevented more effectively than a metal film having pure crystals.

In the diffusion-barrier film in accordance with the present invention, an amorphous metal film containing nitrogen therein lies under a crystalline metal film containing nitrogen therein. Hence, it is possible to effectively prevent copper diffusion, and to ensure high adhesion with an underlying insulating film such as a silicon dioxide film. That is, by forming a copper wiring layer on the diffusion-barrier film in accordance with the present invention, it is possible to not only ensure high crystallinity and high adhesion of a copper wiring layer, but also to prevent copper diffusion.

The method in accordance with the present invention makes it possible to successively form a diffusion-barrier film having a multi-layered structure of first and second films, by varying only power of an electric power source for generating plasma in sputtering in which gas containing nitrogen therein is employed. Herein, the first film is composed of crystalline metal containing nitrogen therein, and the second film is composed of amorphous metal nitride. The barrier film is constituted of metal atomic species of sputter target.

Specifically, an electric power source for generating plasma is first set to generate relatively low power with a concentration of nitrogen in plasma gas being kept constant. A film is formed in such a condition. Target metal makes sufficient reaction with nitrogen, and resultingly, an amorphous metal nitride film is formed. Immediately after the formation of the amorphous metal nitride film, the electric power source is set to generate relatively high power to thereby form a film without allowing sufficient time for reaction between nitrogen and target metal. As a result, there is obtained a crystalline metal film containing nitrogen therein.

Thus, it is possible to successively form a diffusion-barrier film in the same chamber, wherein the diffusion-barrier film has a multi-layered structure including a crystalline metal film containing nitrogen therein and an amorphous metal nitride film.

The method of fabricating a diffusion-barrier film employs RF magnetron sputtering in which rotational magnetic field and RF power are utilized. Since the method makes it possible to carry out sputtering where a nitrogen-containing gas has a pressure equal to or greater than 5 Pa, plasma density of argon which is a main constituent of sputtering gas can be enhanced, and thus, there can be obtained coverage for entirely covering a recess or hole formed at a surface of a substrate, with the diffusion-barrier film.

The method of fabricating a diffusion-barrier film, in accordance with the present invention, includes the step of radiating plasma of argon containing hydrogen therein, to a recess or hole formed at an insulating film formed on a semiconductor substrate. This step reduces a copper oxide film formed on a surface of an underlying copper wiring layer, to thereby turn copper oxide back to copper, ensuring remarkable reduction in re-sputtering of a copper oxide film to a surface of a recess or hole formed at a surface of an insulating film.

Then, a diffusion-barrier film is formed to cover the recess or hole therewith without exposing to atmosphere, wherein the diffusion-barrier film has a multi-layered structure of first and second films, the first film being composed of crystalline metal containing nitrogen therein, the second film being composed of amorphous metal nitride. Then, a thin copper film is formed on the diffusion-barrier film in vacuum. As a result, there is obtained a multi-layered structure comprised of the diffusion-barrier film and the copper wiring film without a metal oxide layer being sandwiched therebetween.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to drawings.

A method of fabricating a diffusion-barrier film in accordance with the preferred embodiment is explained hereinbelow with reference to FIGS. 4A to 4D.

Figure 1:
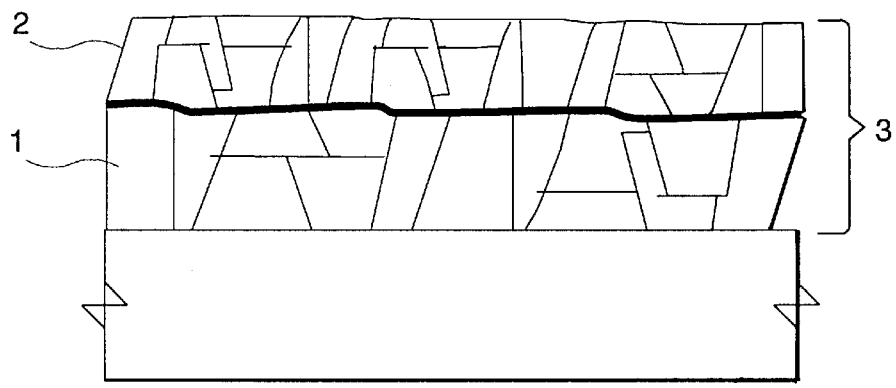
FIG. 1 is a cross-sectional view of a conventional copper wiring structure.
Figure 2:
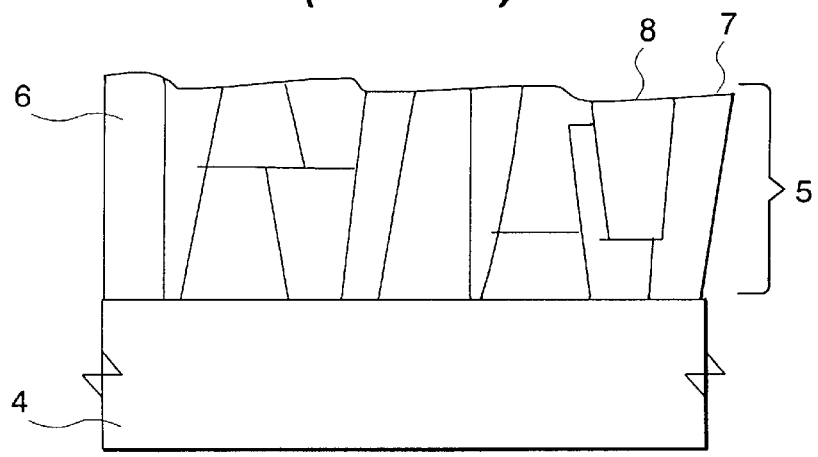
FIG. 2 is a cross-sectional view of another conventional copper wiring structure.
Figure 3:
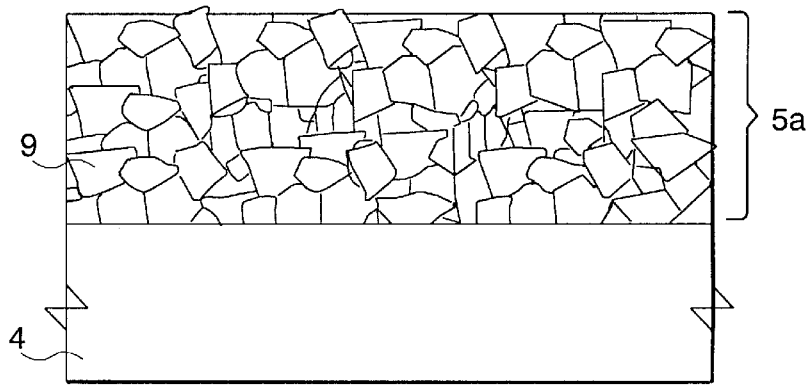
FIG. 3 is a cross-sectional view of still another conventional copper wiring structure.
Figure 4A:
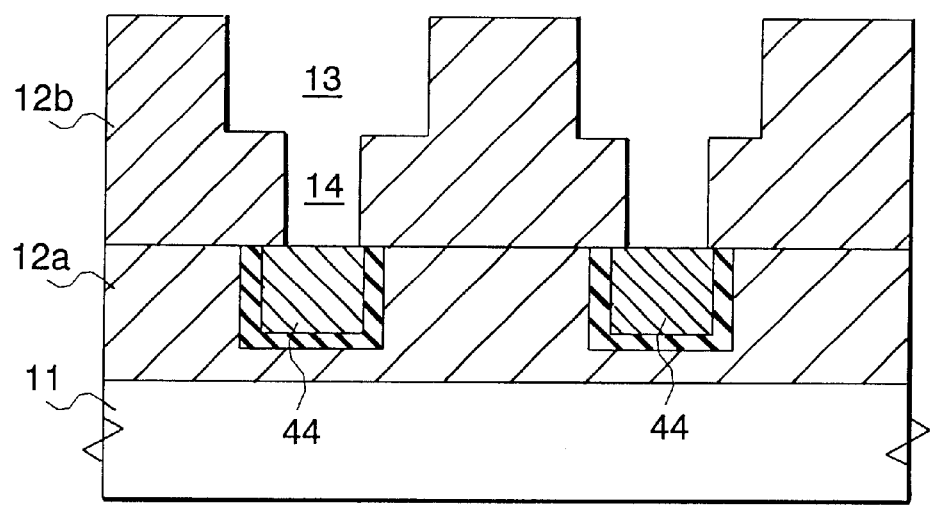
FIG. 4A is a cross-sectional view of a diffusion-barrier film in accordance with the first embodiment of the present invention, illustrating the first step of a method of fabricating the same.

As illustrated in FIG. 4A, a first insulating film 12a is formed on a semiconductor substrate 11, and a second insulating film 12b is formed on the first insulating film 12a. A copper wiring layer 44 is buried in the first insulating film 12a. The second insulating film 12b is formed at a surface thereof with recesses 13 in each of which a wiring is to be formed. Holes 14 reach the first insulating film 12a from a bottom of each of the recesses 13.

First, the semiconductor substrate 11 is exposed to argon plasma containing hydrogen therein, in a first chamber.

Then, the semiconductor substrate 11 is transferred in vacuum to a second chamber, and a film is formed on the semiconductor substrate 11 in a nitrogen-containing gas by sputtering in which a sputtering target is composed of refractive metal.

First, an electric power source for generating plasma is set to generate relatively low power with a concentration of nitrogen in plasma gas being kept constant. As a result, the target metal makes sufficient reaction with nitrogen, and an amorphous metal nitride film 15 is deposited over a surface of the second insulating film 12b, as illustrated in FIG. 4B.

Then, immediately after the formation of the amorphous metal nitride film 15, the electric power source is set to generate relatively high power to thereby form a film without allowing sufficient time for reaction between nitrogen and the target metal. As a result, a crystalline metal film 16 containing nitrogen therein is formed on the amorphous metal nitride film 15.

Figure 4B:
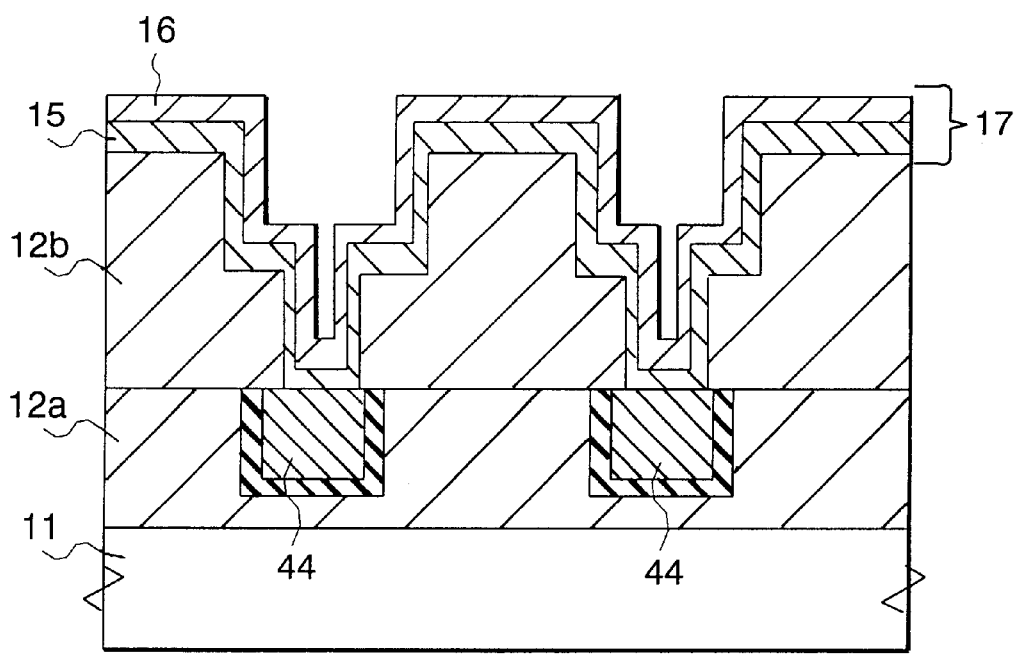
FIG. 4B is a cross-sectional view of a diffusion-barrier film in accordance with the first embodiment of the present invention, illustrating the second step of a method of fabricating the same.

Thus, as illustrated in FIG. 4B, it is possible to successively and effectively fabricate the diffusion-barrier film 17 having a multi-layered structure, on both an inner sidewall and a bottom of the recesses 13 and the holes 14 in the same chamber. By setting a sputtering pressure sufficiently high while deposition of the diffusion-barrier film 17 by sputtering, it would be possible to enhance coverage of the diffusion-barrier film 17.

Figure 4C:
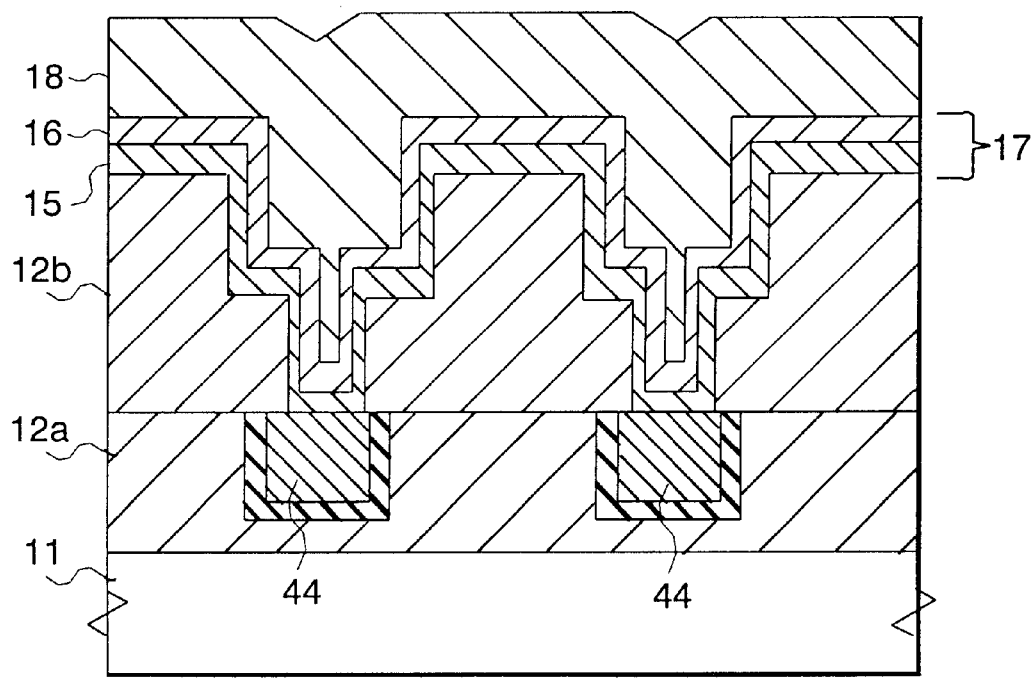
FIG. 4C is a cross-sectional view of a diffusion-barrier film in accordance with the first embodiment of the present invention, illustrating the third step of a method of fabricating the same.

Thereafter, the semiconductor substrate 11 is transferred into a third chamber in vacuum. Then, a copper film 18 is deposited over the diffusion-barrier film 17 in vacuum in the third chamber to thereby completely fill the recesses 13 and the holes 14 with the copper film 18, as illustrated in FIG. 4C. Since the crystal metal film 16 containing nitrogen therein is exposed outside and the semiconductor substrate 11 is transferred in vacuum, an oxide film is not formed at a surface of the crystal metal film 16.

Figure 4D:
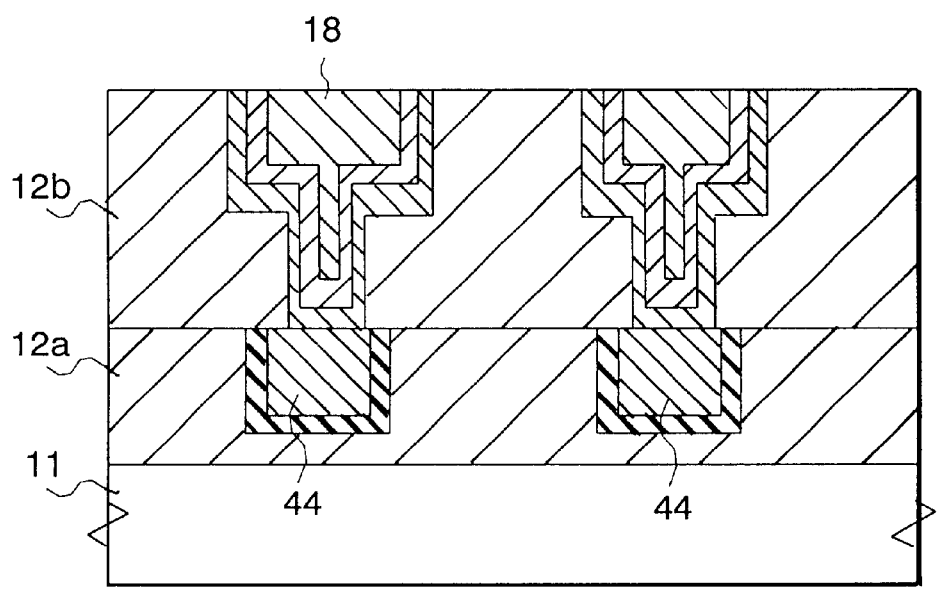
FIG. 4D is a cross-sectional view of a diffusion-barrier film in accordance with the first embodiment of the present invention, illustrating the fourth step of a method of fabricating the same.

Then, as illustrated in FIG. 4D, the diffusion-barrier film 17 and the copper film 18 are removed by CMP until the second insulating film 12b appears. Thus, there is obtained a copper wiring structure having high reliability.

The reason of enhancement in barrier characteristic of preventing copper diffusion is to introduce nitrogen into the metal film 16. In addition, the metal film 16 containing nitrogen ensures high adhesion with copper. The amorphous metal nitride film 15 also has a characteristic of preventing copper diffusion, and further enhances adhesion with the second insulating film 12b. Thus, it is possible to ensure high adhesion between the copper film 18 and the diffusion-barrier film 17, and to prevent copper from being diffused from the copper film 18 into the second insulating film 12b.

Hereinbelow are explained detailed examples of the above-mentioned embodiment.

FIRST EXAMPLE

In the first example, hereinbelow is explained sputtering for fabricating a multi-layered structure comprised of a crystalline metal film containing nitrogen therein and an amorphous metal nitride film.

Figure 5:
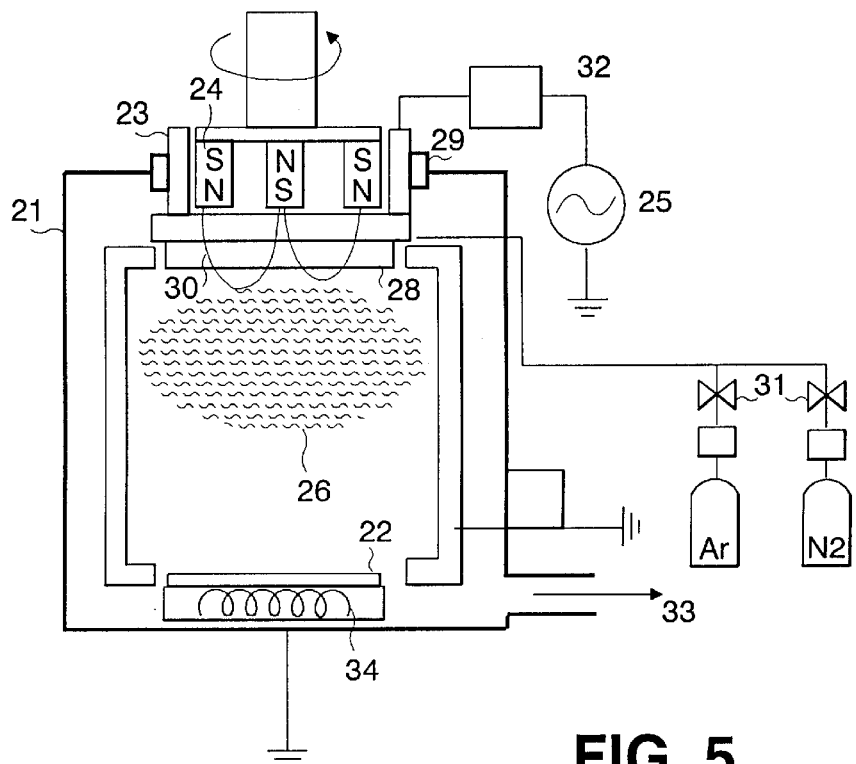
FIG. 5 illustrates a high-pressure RF magnetron sputtering apparatus used in the first embodiment.

The sputtering in the first example is carried out in a RF magnetron sputtering apparatus illustrated in FIG. 5.

In the illustrated RF magnetron sputtering apparatus, a chamber 21 is kept to be in vacuum, specifically, to have an internal pressure of about $1 \times 10^{-7}$ Pa to about $1 \times 10-6$ Pa by means of a pump 33 such as a dry pump, a cryosorption pump or a turbo pump. In the chamber 21 is placed a heater 34 which can heat a semiconductor substrate 22 introduced into the chamber 21, up to about 20 to 300 degrees centigrade. A metal target 28 or the semiconductor substrate 22 is designed to be able to raise or lower, and hence, a distance between the metal target 28 and the semiconductor substrate 22 can be varied in the range of 102 mm to 134 mm.

Argon and nitrogen gases are adjusted with respect to a flow rate by means of mass flow controllers 31, and then, introduced into the chamber 21. When the argon and nitrogen gases are introduced into the chamber 21, the chamber 21 has an internal pressure of about 2 Pa to about 17 Pa.

The metal target 28 has a diameter, for instance, in the range of about 300 mm to about 320 mm. The metal target 28 is fixed to the chamber 21 through a target holder 27, a cathode 23 and insulators 29. In the cathodes 23 are rotatably arranged a plurality of permanent magnets 24. By rotating the permanent magnets 24, magnetic field 30 in the chamber 21 is uniformized, and erosion at a surface of the metal target 28 is also uniformized. As a result, it is possible to enhance uniformity of a film to be formed on the semiconductor substrate 22.

A RF electric power source 25 for introducing RF power into the chamber 21 is in electrical connection with the cathode 23 through a matching box 32 carrying out impedance matching. The RF electric power source 25 applies radio frequency (RF) having a frequency of 13.56 MHz to the metal target 28 having a diameter of 300 mm, at 0 to 10 kW.

Turning the RF electric power source 25 on to thereby introduce RF into the chamber 21, there is generated argon plasma containing nitrogen therein. The target metal 28 is sputtered by argon ions generated in the argon plasma 26. As a result, metal particles of the target metal 28 fly into the semiconductor substrate 22, and thus, the crystalline metal film 16 containing nitrogen therein or the amorphous metal nitride film 15 is formed.

The inventor actually formed a tantalum film covering therewith the hole 14 (see FIG. 4A) formed through the second insulating film 12b by means of the above-mentioned RF magnetron sputtering apparatus. The coverage characteristic of the tantalum film is shown in FIG. 6.

The hole 14 had a diameter in the range of 0.3 $\mu$m to 1.5 $\mu$m. The second insulating film 12b had a thickness of about 1.5 $\mu$m where the hole 14 was formed.

Figure 6:
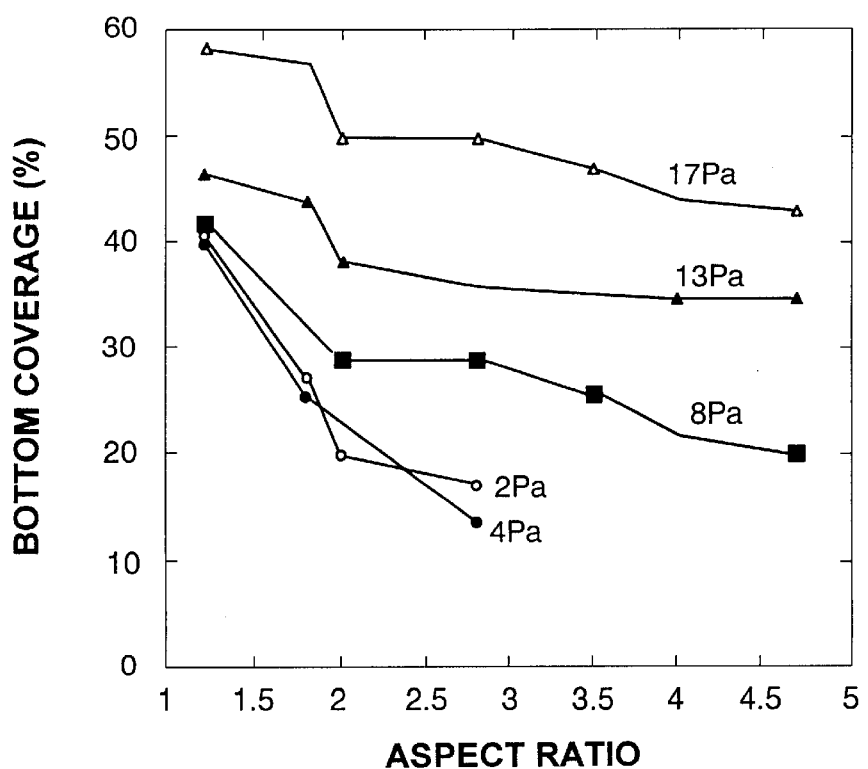
FIG. 6 is a graph showing coverage characteristic of a tantalum film in high-pressure RF magnetron sputtering.

As is obvious in view of FIG. 6, as a sputtering pressure is increased from 2 Pa to 17 Pa, bottom coverage is enhanced. Herein, bottom coverage is defined as a ratio of a thickness of the tantalum film at a bottom of the hole 14 to a thickness of the tantalum film at a surface of the second insulating film 12b. Specifically, when a sputtering pressure is over 5 Pa, sufficient coverage can be obtained to a hole having a great aspect ratio.

A thickness of the tantalum film at an inner sidewall of the hole 14 is equal to about a half of a thickness of the tantalum film at a bottom of the hole 14. As a sputtering pressure is increased, the tantalum film covers an inner sidewall of the hole 14 therewith to a greater degree.

The reason of this phenomenon is considered as follows.

Figure 7:
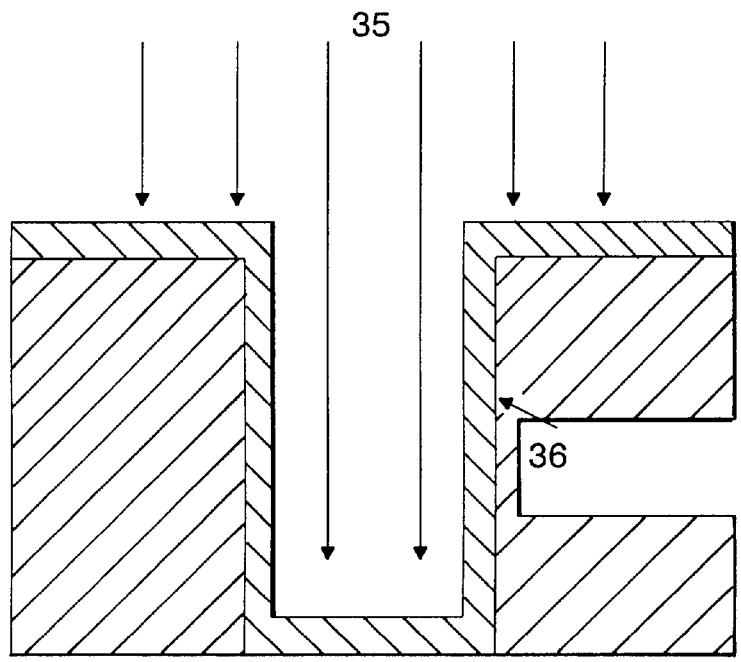
FIGS. 7 and 8 are cross-sectional views of a recess covered with a tantalum film in high-pressure RF magnetron sputtering.

The first reason is an increase in the number of Ta ions in plasma gas, as illustrated in FIG. 7.

As a sputtering pressure is increased, tantalum atomics increasingly make collision with excited argon atomics, resulting in that argon atomics are facilitated to be ionized. The resultant tantalum ions are attracted to negative self-bias generated at the semiconductor substrate 22. As a result, an incident angle at which tantalum ion flux 35 is radiated to the semiconductor substrate 22 becomes nearly 90 degrees. Thus, overhanging which occurs in the vicinity of an edge of recess or hole in conventional sputtering is suppressed, ensuring tantalum atomics to reach a bottom of the hole 14 or recess 13. As a result, a tantalum film 36 entirely covers an inner sidewall of the hole 14.

Figure 8:
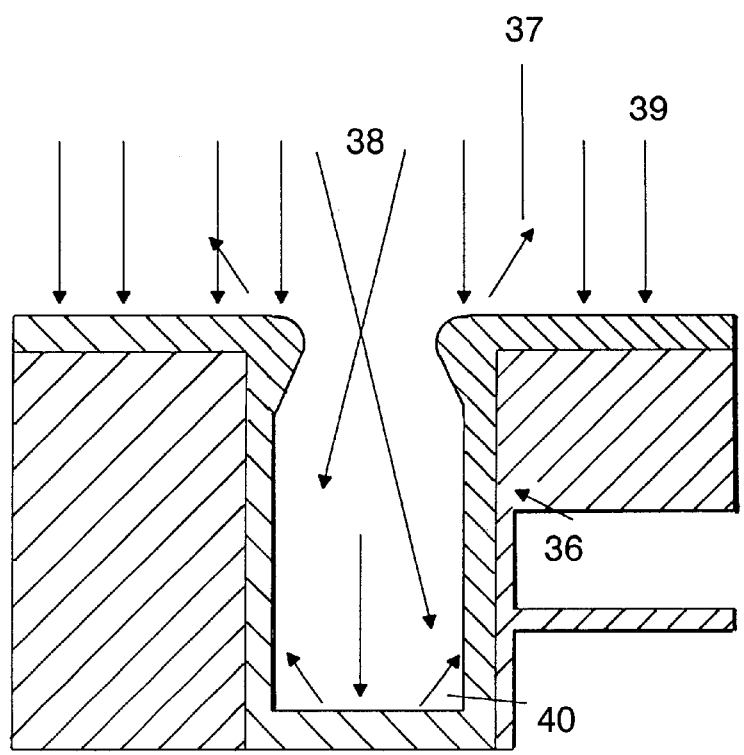

The second reason is that the deposited tantalum film 36 is re-sputtered by argon ions 39, as illustrated in FIG. 8.

The argon ions 39 which are primary constituents of plasma gas are accelerated by electric field and reach not only a target but also the semiconductor substrate 22 which is in a condition of negative self-bias. This means that the tantalum film 36 having been deposited onto the semiconductor substrate 22 is re-sputtered. Since the tantalum film deposited in the vicinity of an edge of the hole 14 or recess 13 and causing overhanging is re-sputtered by the argon ions 39, as indicated with an arrow 37, tantalum atomics 38 directing to a bottom of the hole 14 or recess 13 are not interfered at the edge of the hole 14 or recess 13. Accordingly, it is ensured that a tantalum film is deposited on a bottom and an inner sidewall of the hole 14 or recess 13.

In addition, since the tantalum film 36 deposited on a bottom of the hole 14 or recess 13 is re-sputtered by the argon ions 39, tantalum atomics generated by re-sputtering are deposited again on an inner sidewall 40 of the hole 14 or recess 13, ensuring enhancement in coverage at the sidewall 40 of the hole 14 or recess 13.

It is not possible to determine which is a main reason for enhancement in coverage among the above-mentioned first and second reasons. However, since mean free path of plasma ion is just a few millimeters under a pressure over 5 Pa, it is considered that almost 90 degrees of an incident angle of the tantalum ion flux 35 does not contribute to enhancement in coverage so much. The main reason why the coverage is enhanced is considered that argon ions are generated in a sufficient density by virtue of a high pressure, and a tantalum film having been deposited are re-sputtered by the argon ions.

In accordance with the experiments the inventor had conducted, it was confirmed that coverage was enhanced in sputtering of a tantalum nitride film, carried out under a high pressure over 5 Pa.

As mentioned so far, it is preferable that a sputtering pressure is set equal to or greater than 5 Pa in RF magnetron sputtering.

SECOND EXAMPLE

Figure 9:
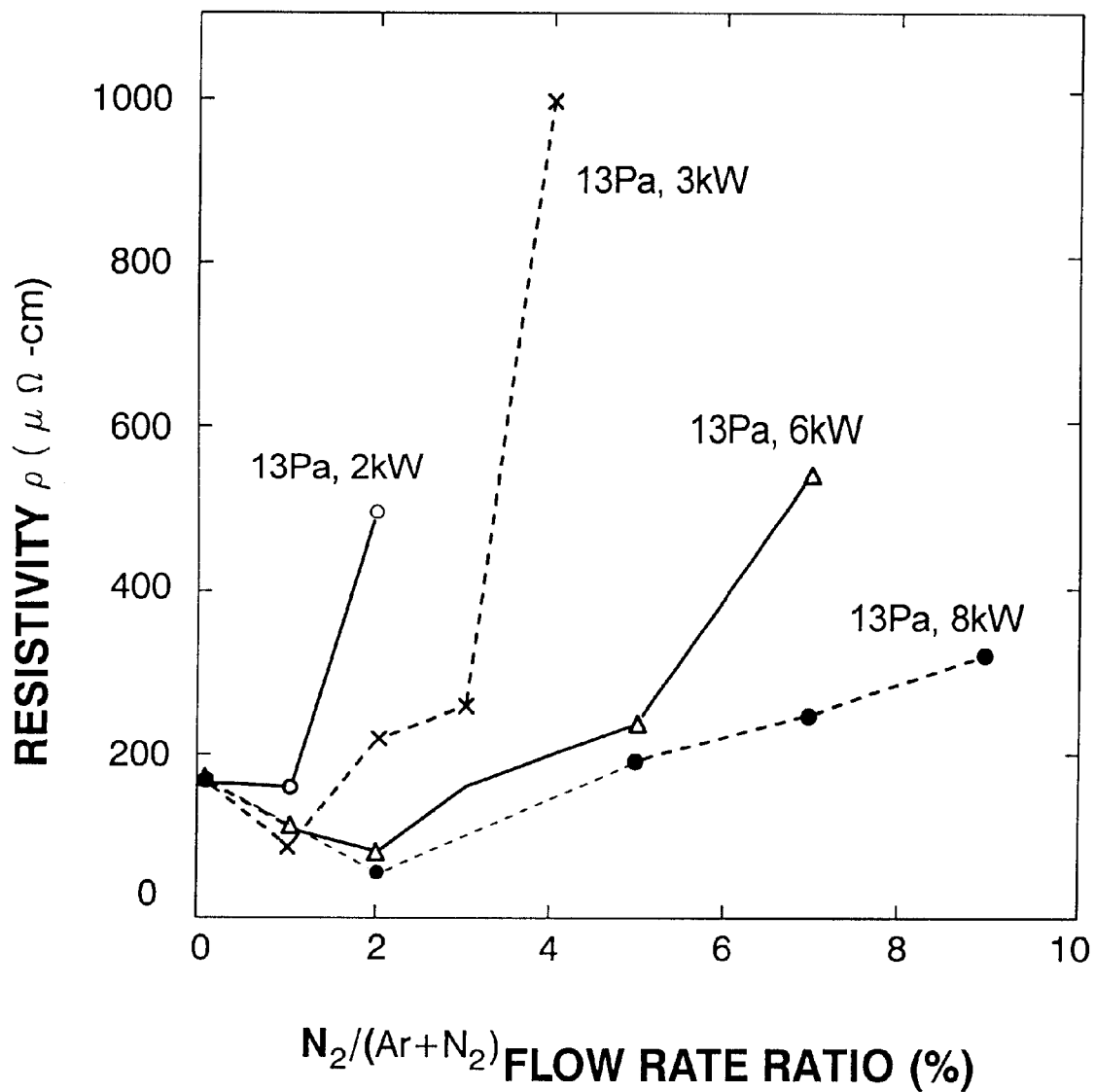
FIG. 9 is a graph showing a relation among a ratio of a nitrogen gas in a mixture gas introduced into a chamber, RF power, and resistivity of a film formed by sputtering.

FIG. 9 shows a relation between a flow rate ratio and resistivity of a film formed by high-pressure RF magnetron sputtering having been explained in the first example, for various RF powers. Herein, the flow rate ratio is defined as a ratio of a volume of argon gas to be introduced into the chamber 21 to a volume of nitrogen gas to be introduced into the chamber 21 ($N_2/(Ar+N_2)$).

The relation shown in FIG. 9 was observed when the chamber 21 had a pressure of 13 Pa, the semiconductor substrate 22 was heated at 200 degrees centigrade, the permanent magnets 24 were rotated at 10 r.p.m., and the distance between the metal target 28 and the semiconductor substrate 22 was 134 mm.

As a ratio of $N_2$ gas in the flow rate ratio $N_2/(Ar+N_2)$ is increased, the resistivity is once reduced, and thereafter, increased again, regardless the RF power. However, an increase rate of the $N_2$ gas ratio is dependent on the RF power. The resistivity increases at a lower rate at the greater RF power.

FIGS. 10 to 13 show how X-ray diffraction (XRD) patterns vary as the $N_2$ gas ratio is varied when RF power of 6 kW (8.5 W/cm$^2$) is applied to the tantalum target having a diameter of 300 mm.

Specifically, FIGS. 10 to 13 shows XRD patterns when the $N_2$ gas ratio is equal to 0%, 1%, 5%, and 7% respectively. Hereinbelow are explained FIGS. 10 to 13 in comparison with FIG. 9.

Figure 10:
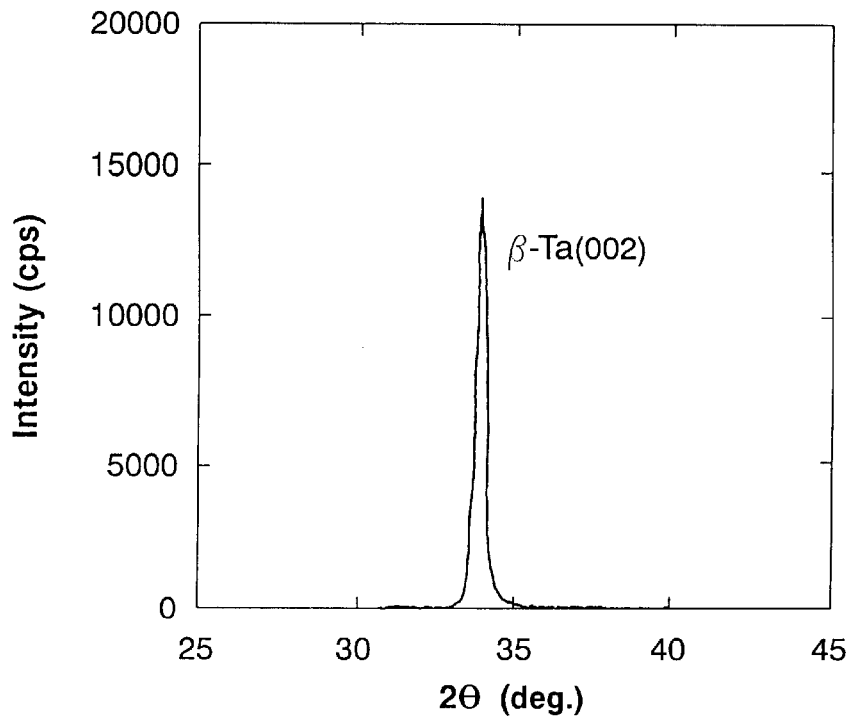
FIGS. 10 to 18 are graphs each showing film quality and characteristics of TaN and Ta films in high-pressure RF magnetron sputtering.

When the $N_2$ gas ratio is equal to 0%, there is obtained a β-Ta(002)-oriented crystalline tantalum film which has resistivity in the range of about 160 to 200 $\mu\Omega$-cm, as illustrated in FIG. 10.

Figure 11:
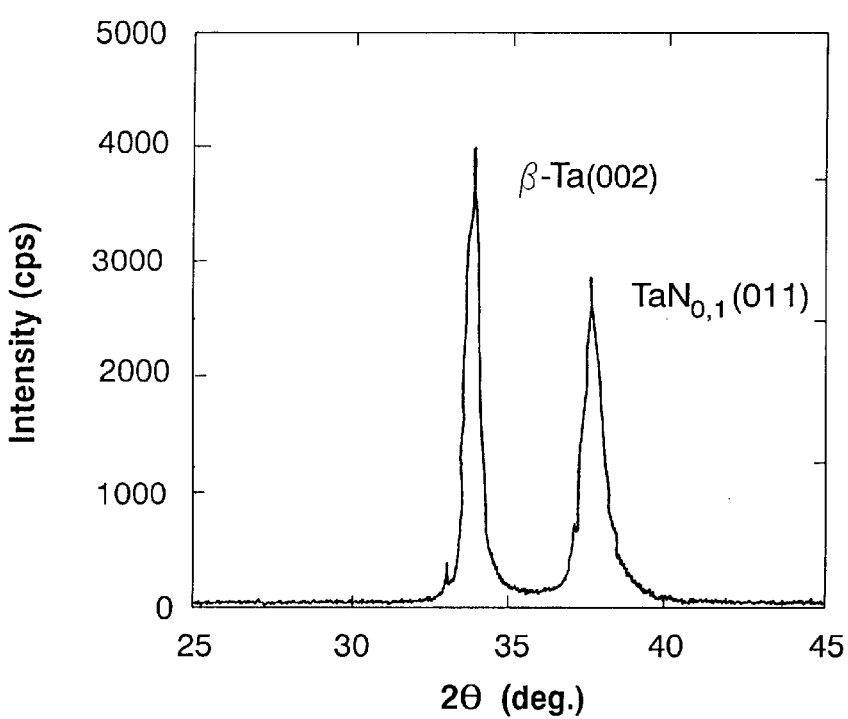

When the $N_2$ gas ratio is equal to 1%, there is obtained a crystalline metal film (herein, a tantalum film) containing nitrogen therein, which includes β-Ta and $TaN_{0.1}$ in mixture and which has resistivity in the range of about 100 $\mu\Omega$-cm, as illustrated in FIG. 11.

Figure 12:
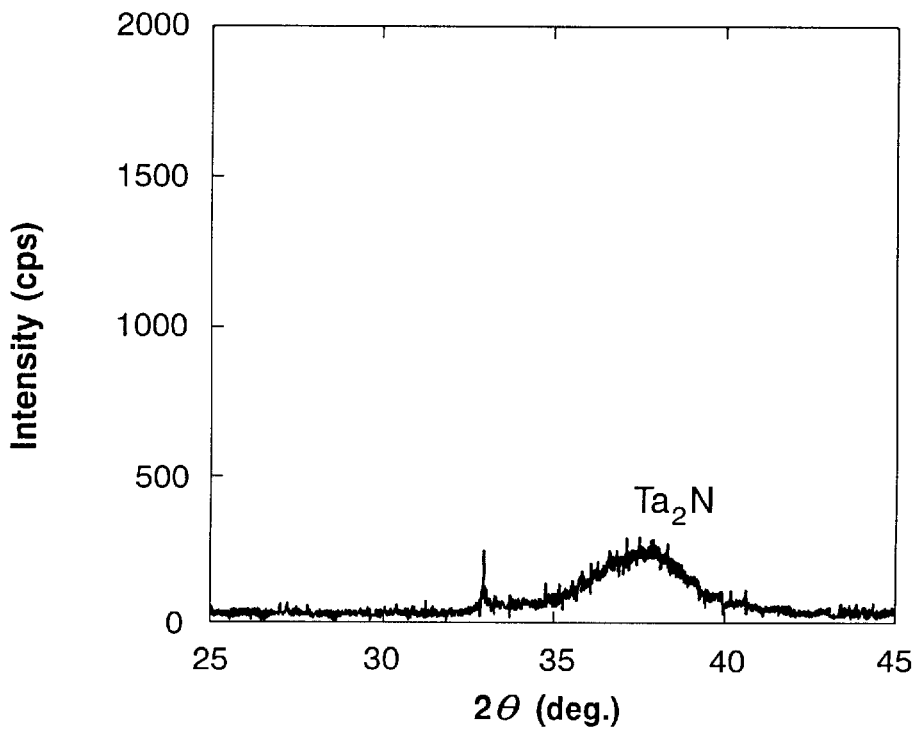

When the $N_2$ gas ratio is equal to 5%, it is understood in view of FIG. 12 that XRD pattern strength is reduced, and hence, there is formed an amorphous metal nitride film, which has resistivity in the range of about 200 to 250 $\mu\Omega$-cm.

Figure 13:
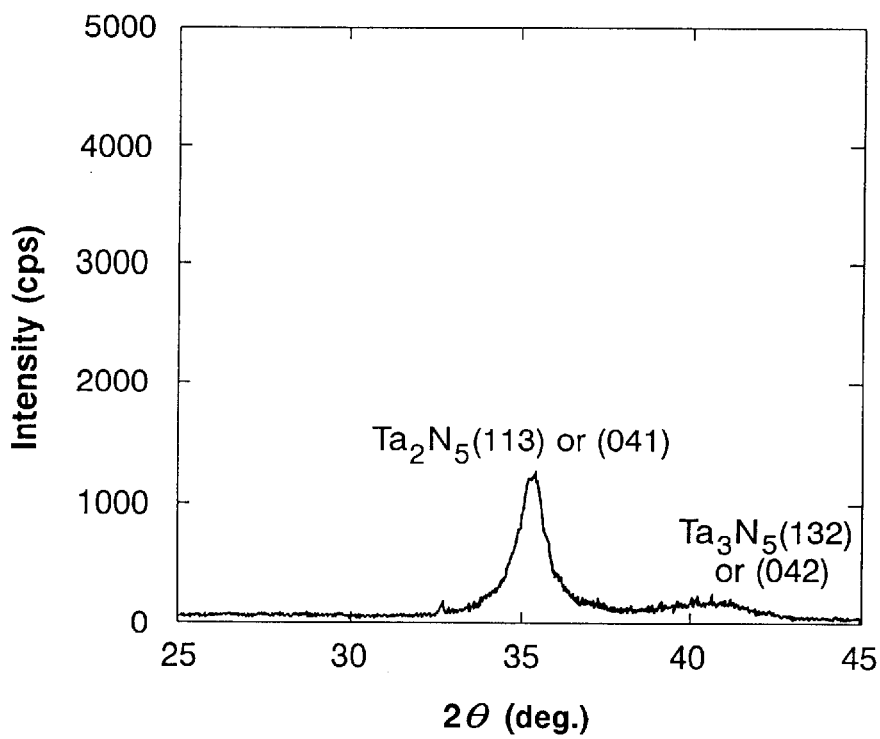

When the $N_2$ gas ratio is equal to 7%, a crystalline metal nitride film ($Ta_3N_5$) is formed, and resistivity is further increased, as illustrated in FIG. 13.

As mentioned above, when the tantalum target is selected, a crystalline structure, composition and resistivity of a film to be formed by sputtering vary in dependence on both a concentration of nitrogen gas in sputtering gas and RF power. Conversely speaking, this means that it is possible to control characteristics of a film to be formed by sputtering, by controlling both a concentration of nitrogen gas in sputtering gas and RF power. The present invention is based on this discovery.

However, it is difficult to vary a flow rate of sputtering gas (that is, a pressure of sputtering gas) and $N_2$ composition ratio in sputtering. Accordingly, it is necessary in practical use to keep both a flow rate of sputtering gas (that is, a pressure of sputtering gas) and $N_2$ composition ratio constant, and to vary only RF power, to thereby control a crystalline structure, composition and resistivity of a film to be formed by sputtering.

Figure 14:
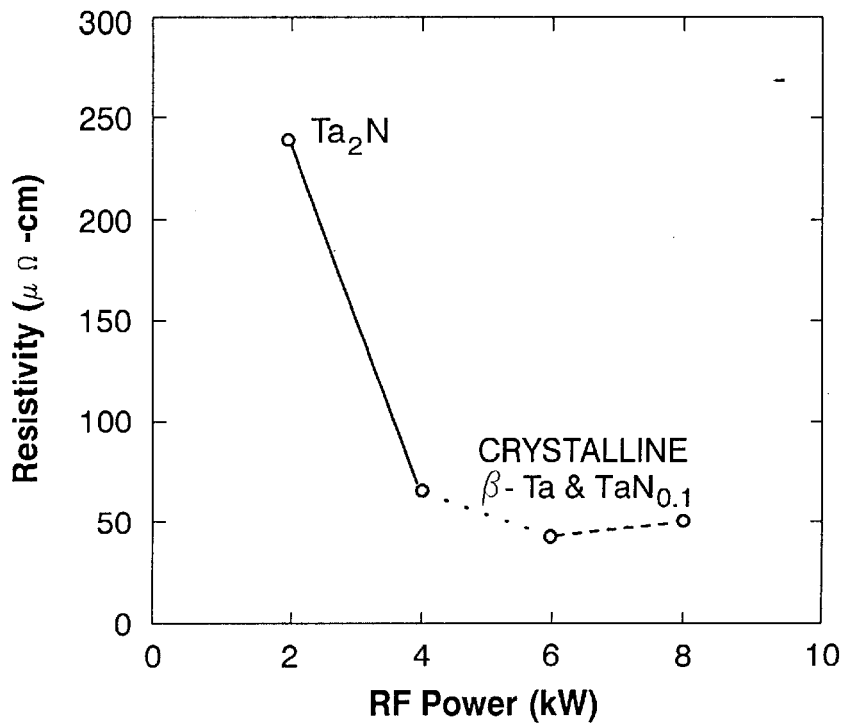

FIG. 14 shows how resistivity varies when only RF power is varied while a $N_2$ gas ratio is kept fixed at 2%. As is obvious in view of FIG. 14, it is understood that it is possible to control film quality and resistivity of a film to be formed by sputtering, even when only RF power is varied. In FIG. 14, resistivity is varied when a gas pressure is equal to 10 Pa, the permanent magnets are rotated at 10 r.p.m., and the substrate was heated at 200 degrees centigrade.

FIGS. 15 to 18 show XRD characteristics relative to RF power. FIGS. 15 to 18 show XRD characteristics observed when RF power is equal to 2 kW, 3 kW, 6 kW and 8 kW, respectively.

Figure 15:
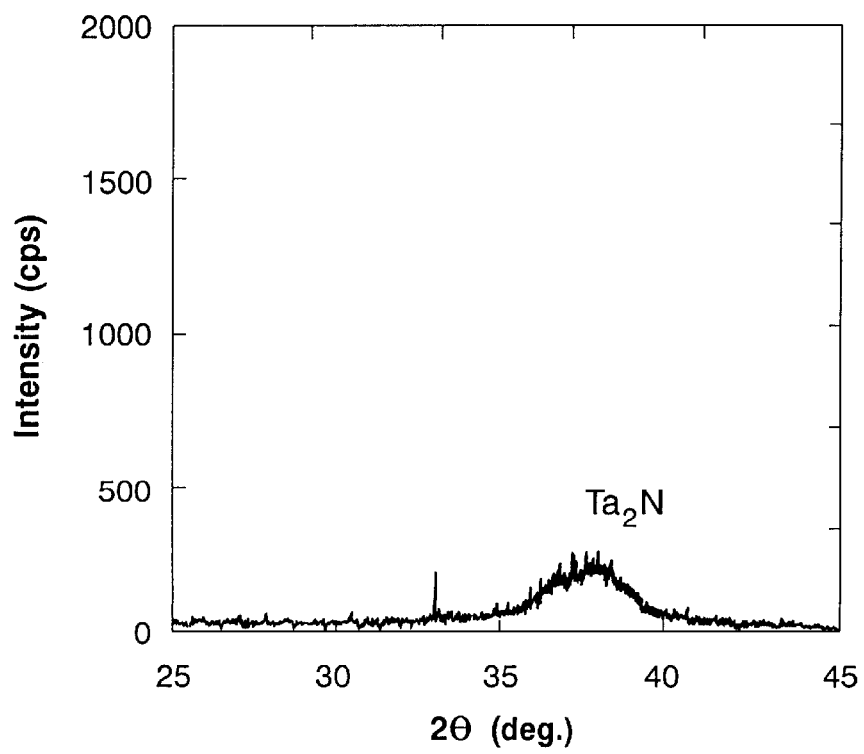
Figure 16:
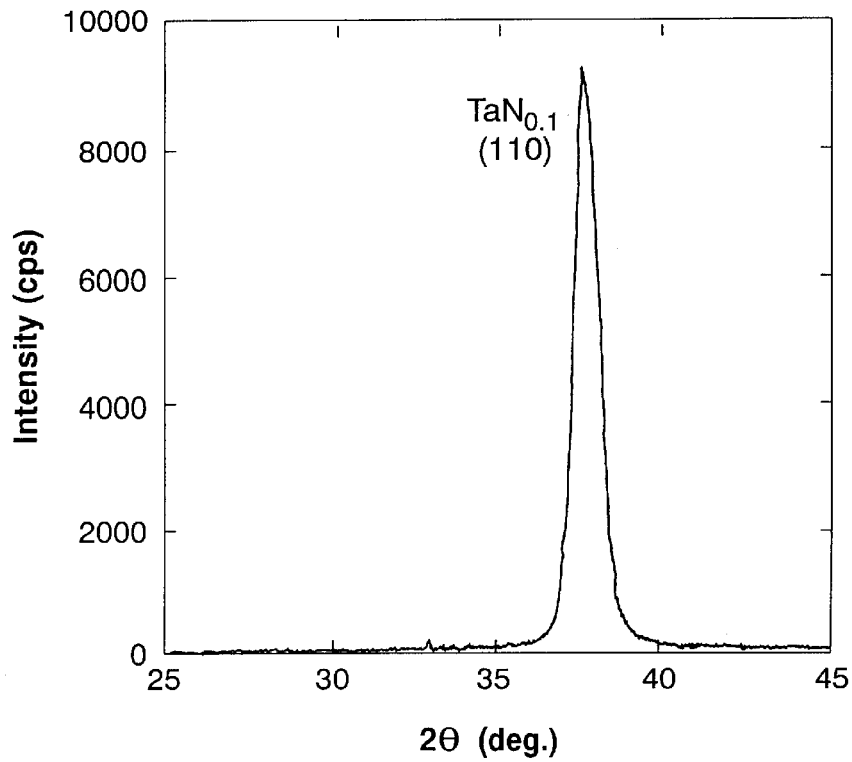
Figure 17:
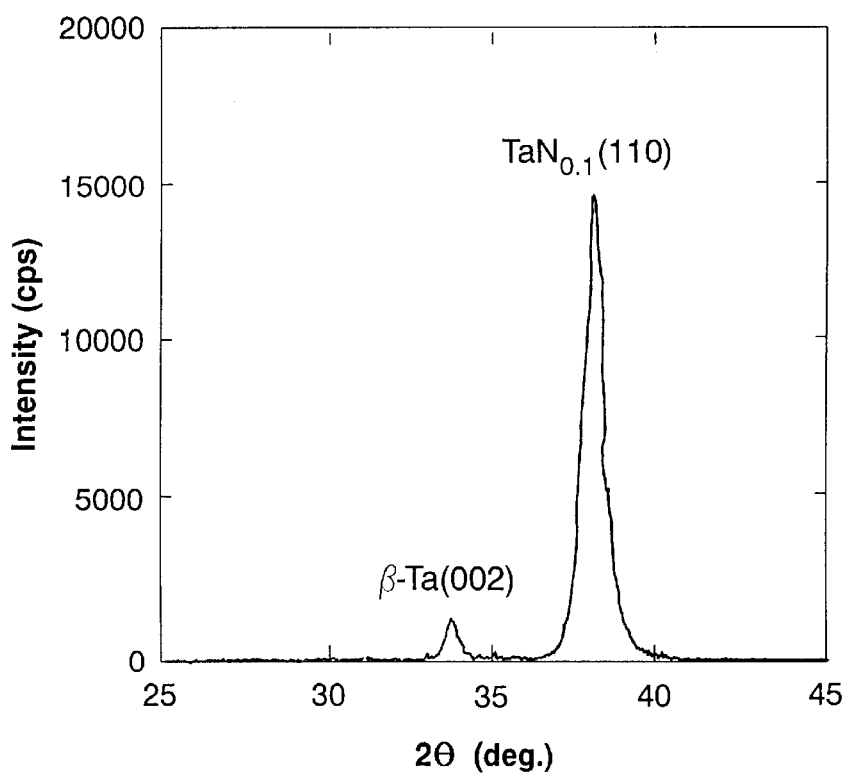
Figure 18:
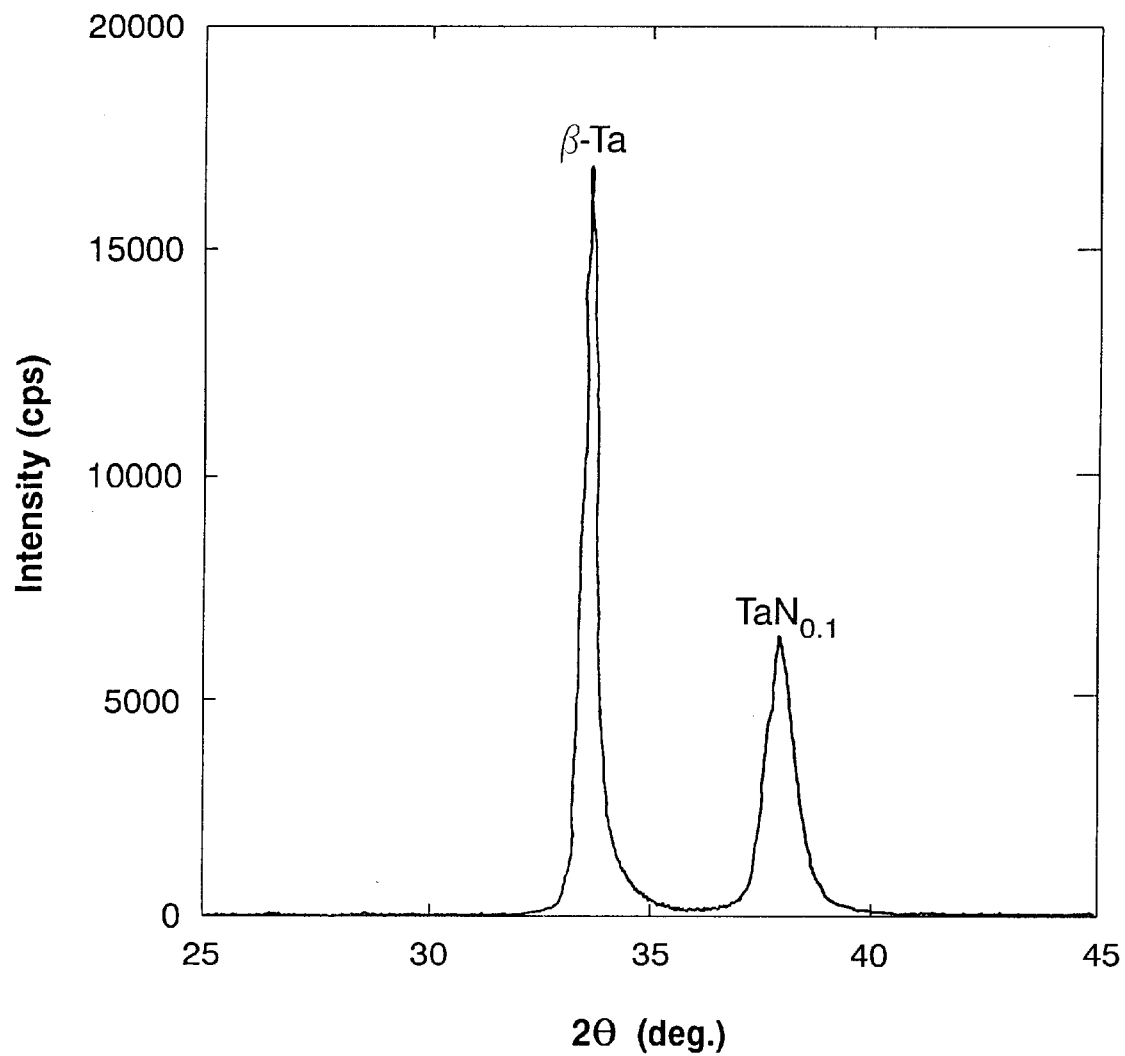

Specifically, when RF power is equal to 2 kW, there is obtained amorphous $Ta_2N$, as illustrated in FIG. 15. By increasing RF power, there is obtained crystalline $TaN_{0.1}$. When RF power is equal to 8 kW, there is obtained a crystalline metal film containing nitrogen therein, which includes a β-Ta film and $TaN_{0.1}$ in mixture.

Figure 19:
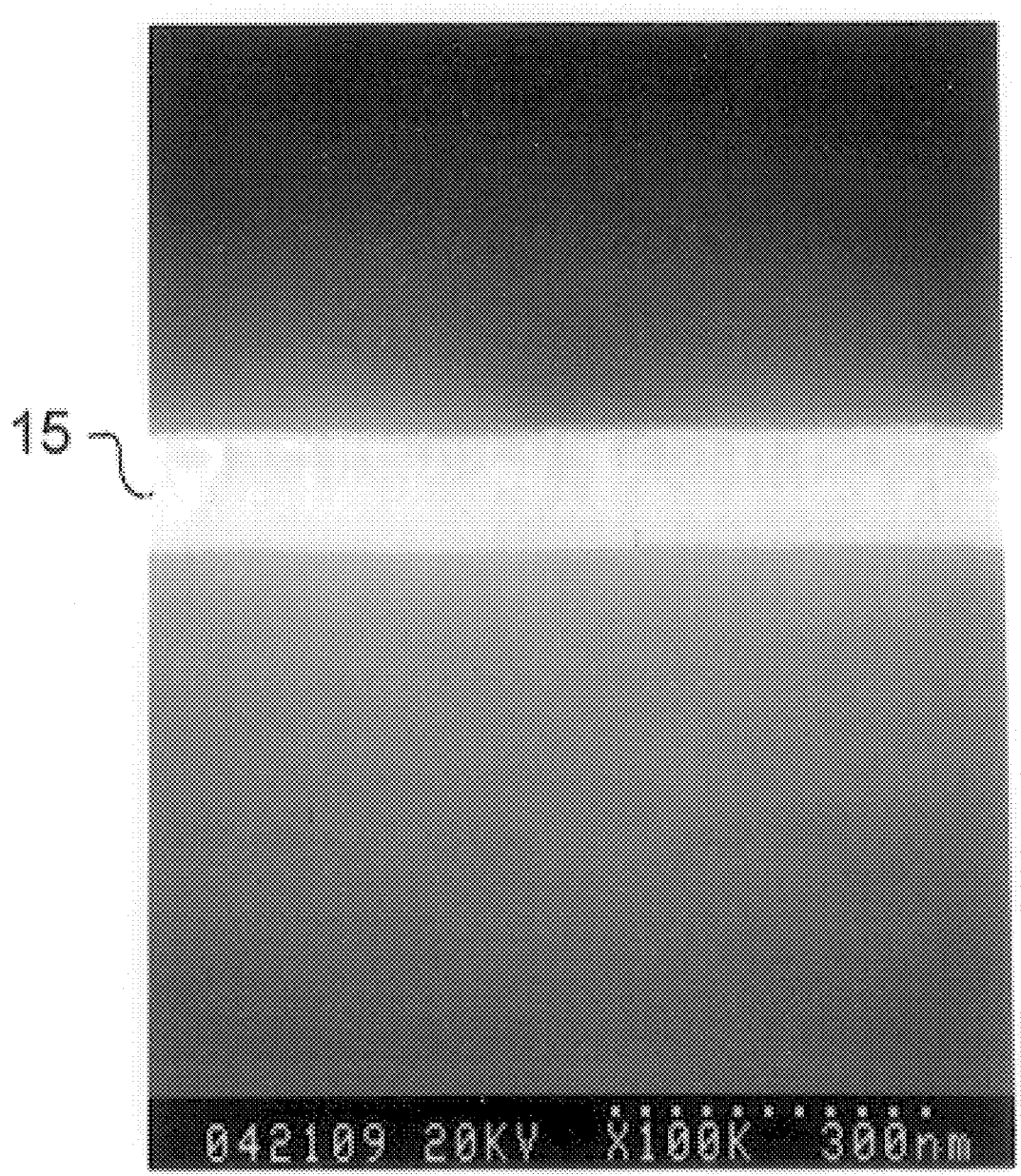
FIGS. 19 and 20 are photographs of a film formed by high-pressure RF magnetron sputtering which photograph is taken by means of a scanning electron microscopy (SEM).
Figure 20:
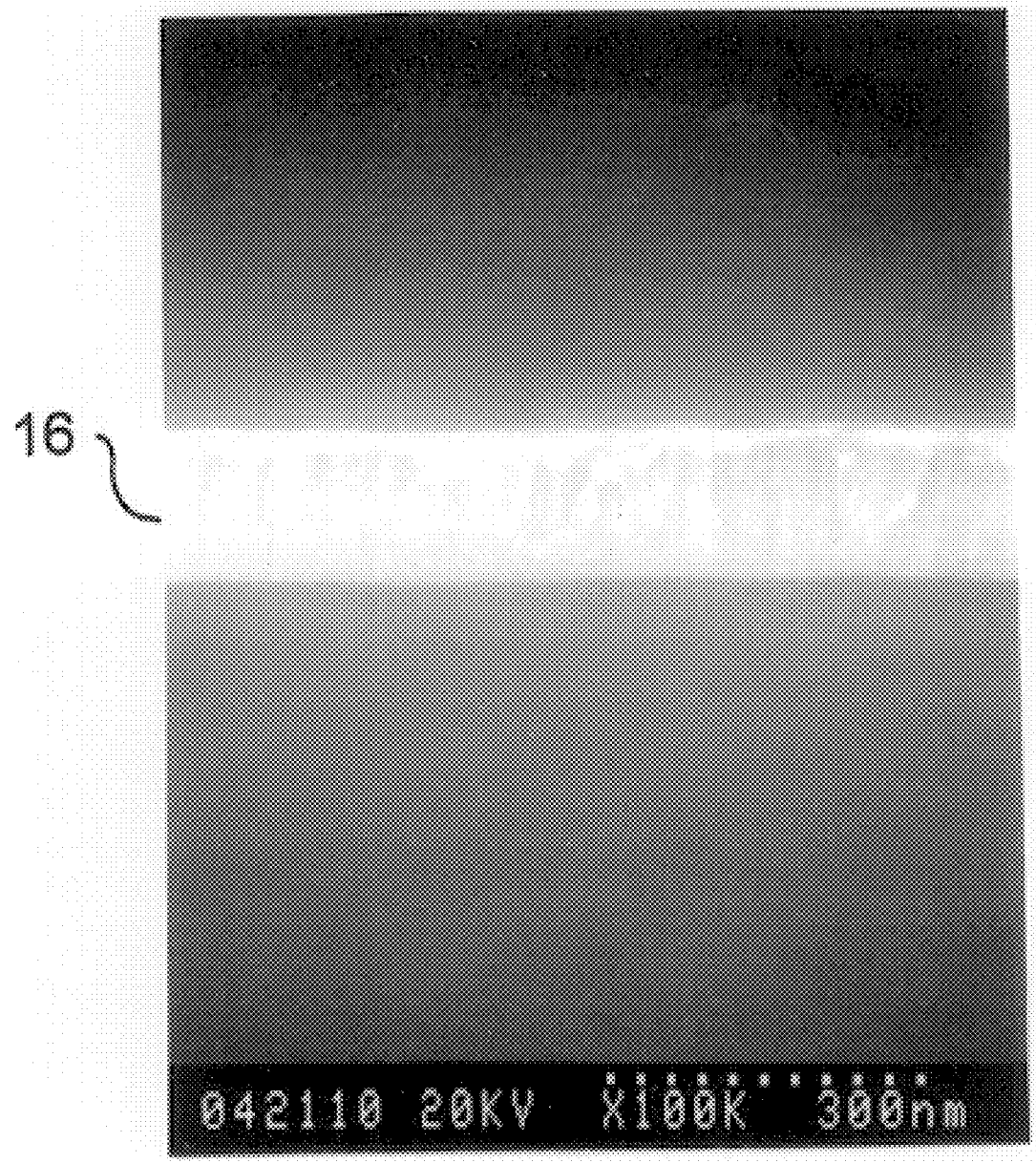

FIGS. 19 and 20 are SEM (Scanning Electron Microscopy) photographs of films obtained when RF power is set equal to 2 kW and 8 kW, respectively.

When RF power is set equal to 2 kW, as is obvious in view of XRD illustrated in FIG. 15, there is not observed grain boundary, because a deposited film has an amorphous structure. In contrast, when RF power is set equal to 8 kW, as is obvious in view of XRD illustrated in FIG. 18, there is obtained a crystalline film including a β-Ta film and $TaN_{0.1}$ in mixture, and having a pillar-like structure.

Figure 21:
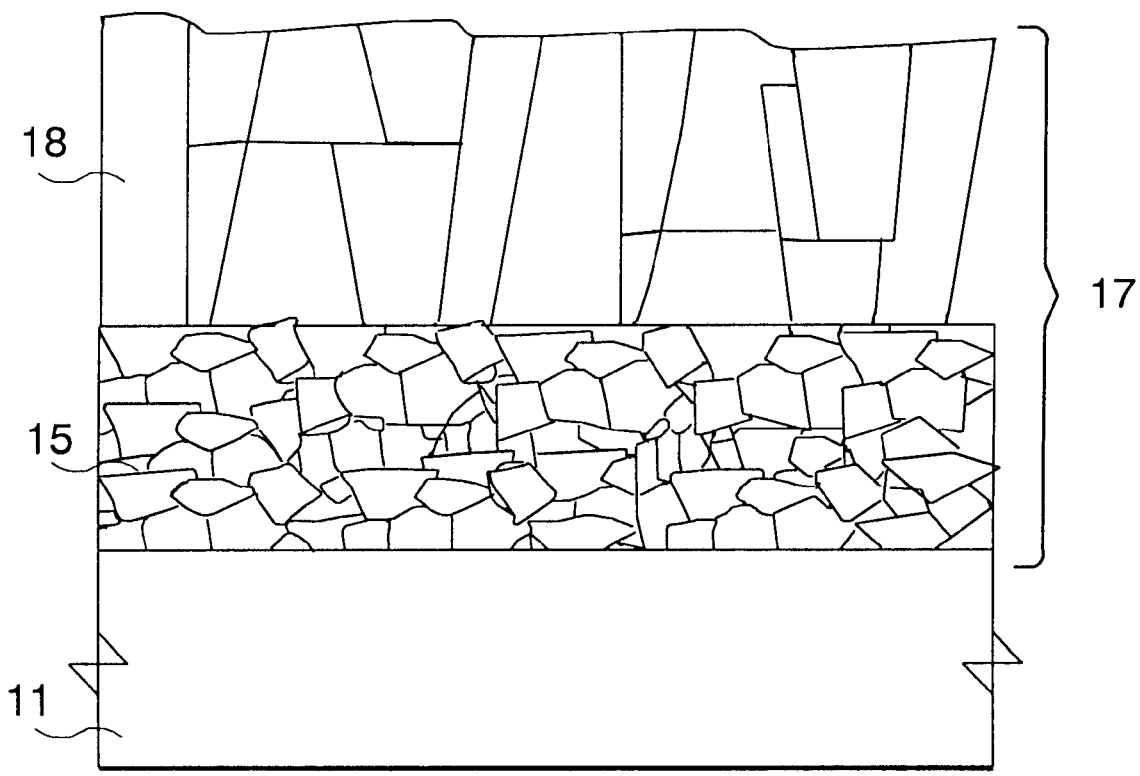
FIG. 21 is a cross-sectional view of a diffusion-barrier film formed by high-pressure RF magnetron sputtering which barrier-diffusion film is comprised of a crystalline Ta film containing nitrogen in solid solution and an amorphous metal TaN film.

That is, if $Ta_2N$, which is an amorphous metal nitride film, is deposited at 2 kW of RF power, and RF power is increased up to 8 kW immediately when the film has acquired a desired thickness, the film is turned into a crystalline metal film containing nitrogen therein. As a result, as illustrated in FIG. 21, a diffusion-barrier film 17 is formed on a semiconductor substrate 11 where the diffusion-barrier film 17 has a multi-layered structure comprised of an amorphous metal nitride film 15 and a crystalline metal film 16 containing nitrogen therein. Specifically, the amorphous metal nitride film 15 is an amorphous $Ta_2N$ film, and the crystalline metal film 16 is composed of crystalline β-Ta and crystalline $TaN_{0.1}$ in mixture.

Figure 22:
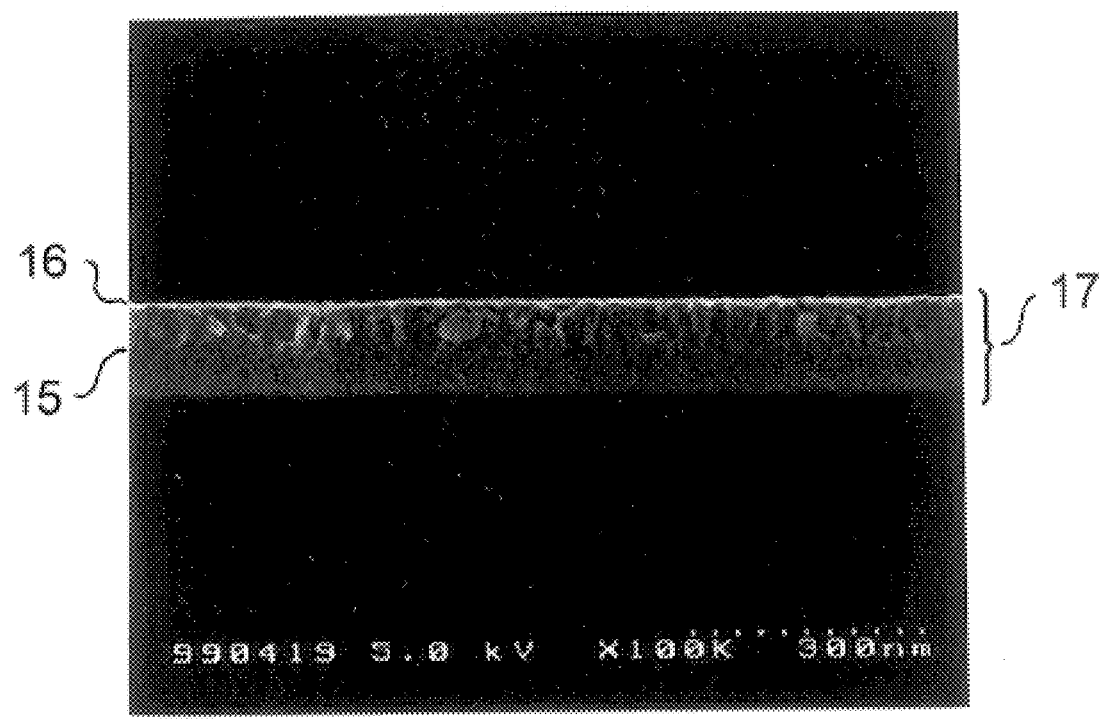
FIG. 22 is a photograph of a film formed by high-pressure RF magnetron sputtering which photograph is taken by means of a scanning electron microscopy (SEM).

FIG. 22 is a SEM photograph of a cross-section of the diffusion-barrier film 17 which is formed by changing sputtering power from 2 kW to 8 kW while a TaN film is being deposited, to thereby successively deposit the crystalline metal film 16 and the amorphous metal nitride film 15 each by a thickness of about 500 angstroms. It is confirmed in FIG. 22 that the amorphous $Ta_2N$ film 15 and the crystalline metal film 16 containing nitrogen therein form a multi-layered structure.

The reason of this phenomenon is considered as follows.

When sputtering power is set equal to 2 kW, since a sputtering rate caused by argon ions is relatively low, there is sufficient time for a tantalum target to be nitrided by $N_2$ at a surface thereof. Hence, the tantalum target is nitrided at a surface thereof, and turned into $Ta_2N$. Since the thus produced $Ta_2N$ is sputtered by argon ions, a $Ta_2N$ film is deposited. However, when sputtering power is set equal to 8 kW, the tantalum target is sputtered by argon ions before a surface of the tantalum target is sufficiently nitrided. As a result, there is obtained a tantalum film slightly containing nitrogen.

Figure 23:
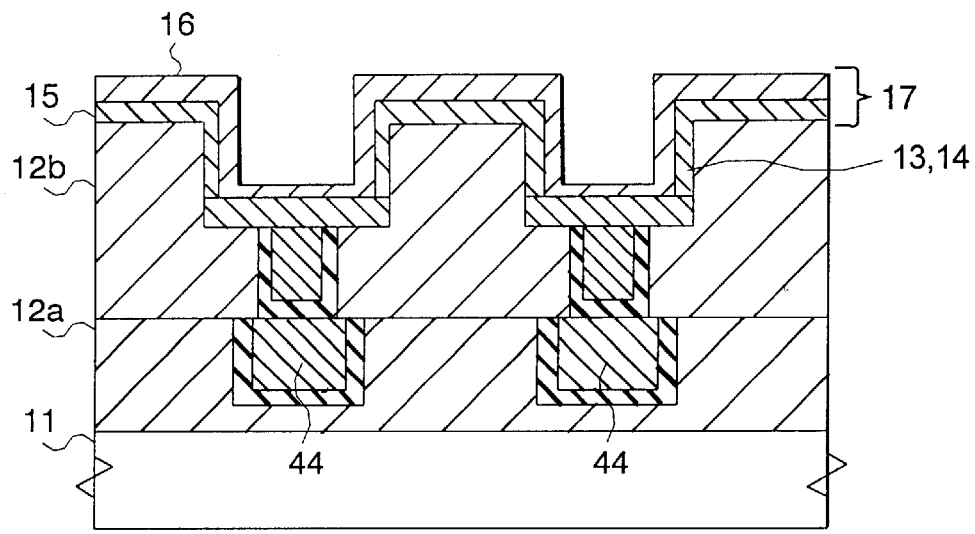
FIG. 23 is a cross-sectional view of a diffusion-barrier film covering a recess therewith.

By utilizing the above-mentioned phenomenon, it is possible to form the diffusion-barrier film 17 having a multi-layered structure and covering therewith the recess 13 or the hole 14 formed at the second insulating film 12b formed on the semiconductor substrate 11, as illustrated in FIG. 23.

The lower film or amorphous metal nitride ($Ta_2N$) film 15 is required to have such a thickness that barrier characteristic of preventing copper diffusion is ensured and adhesion with the underlying insulating film 12b is also ensured. A desired thickness of the amorphous metal nitride ($Ta_2N$) film 15 is in the range of about 80 angstroms to about 150 angstroms.

On the other hand, the crystalline nitrogen-containing metal film 16 composed of crystalline β-Ta and crystalline $TaN_{0.1}$ in mixture is required to have such a thickness that barrier characteristic of preventing copper diffusion is ensured and adhesion with copper is also ensured. A desired thickness of the crystalline metal film 16 is in the range of about 60 angstroms to about 300 angstroms.

THIRD EXAMPLE

The RF magnetron sputtering having been explained in the first example makes it possible to enhance coverage characteristic of a deposited film for covering a recess or hole therewith, by introducing a gas having a higher pressure than usual, specifically, a pressure equal to or greater than 5 Pa, into a chamber. That is, it is possible to form the multi-layered barrier film 17 under desired coverage characteristic by switching RF power with a sputtering pressure being kept equal to or greater than 5 Pa, even when there is carried out dual-damassin process in which the recess 13 and the hole 14 formed at a surface of the second insulating film 12b formed on the semiconductor substrate 11 are concurrently filled with the diffusion-barrier film 17.

FOURTH EXAMPLE

In the above-mentioned first and second examples, the process in which a multi-layered barrier film is successively formed by switching RF power while the film is being formed is applied to RF magnetron sputtering. This process may be applied to DC magnetron sputtering, as illustrated in FIG. 24, though a $N_2$ gas ratio and RF power are different from those in the first and second examples.

Figure 24:
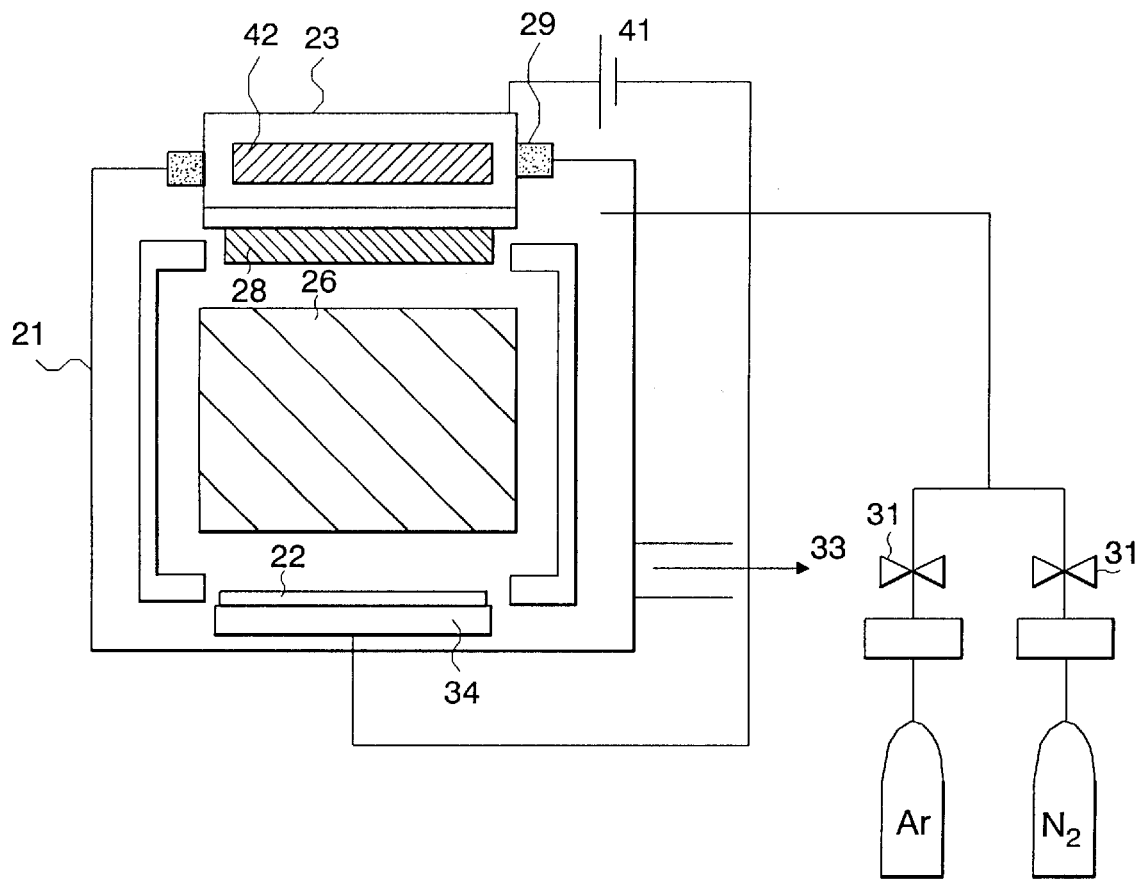
FIG. 24 illustrates a DC magnetron sputtering apparatus used in the fourth embodiment.

FIG. 24 illustrates a DC magnetron sputtering apparatus. The apparatus is comprised of a chamber 21, a heater 34 fixed on a bottom of the chamber 21 for heating a semiconductor substrate 22, a target metal 28 fixed to a top of the chamber 21 by means of insulators 29 and a cathode 23, a pump 33 for exhausting air from the chamber 21 such that a pressure in the chamber 21 is in the range of about $1\times10^{-7}$ Pa to about $1\times10^{-6}$ Pa, a magnet 42 positioned above the target metal 28, mass flow controllers 31 for adjusting flow rates of argon gas and nitrogen gas, and allowing the gases to enter the chamber 21, and a DC electric power source 41 for applying a DC voltage to both the cathode 23 and the heater 34.

Turning the DC electric power source 41 on, argon plasma containing nitrogen therein is generated in the chamber 21.

FIFTH EXAMPLE

In the first and second examples, there is formed only one via-hole and wiring. However, it should be noted that the present invention may be applied to a copper wiring structure including two or more via-holes and wirings.

Figure 25:
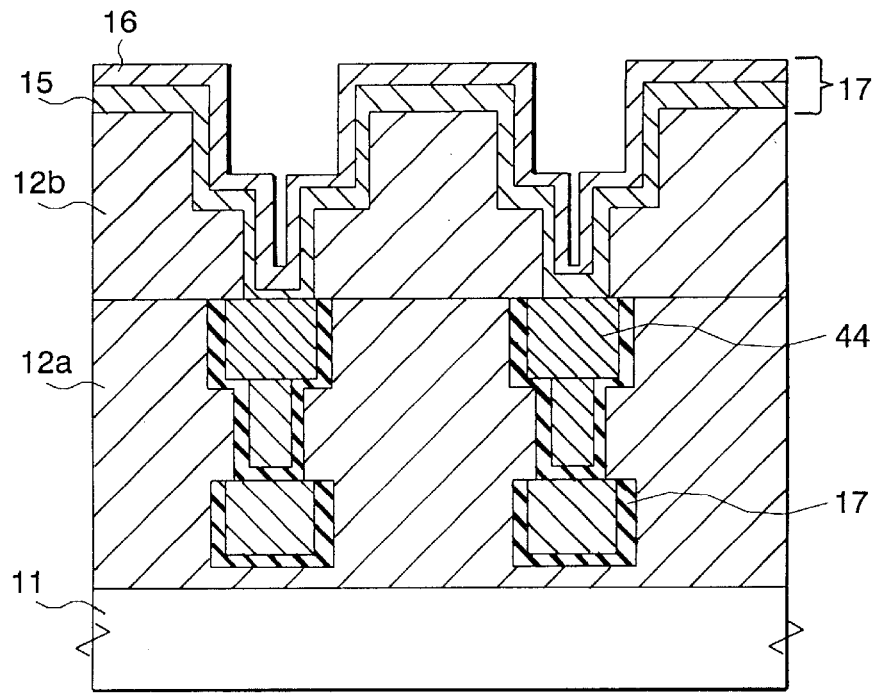
FIG. 25 is a cross-sectional view of a diffusion-barrier film covering a recess formed at a surface of an insulating film formed above a lower wiring layer.

In the fifth example, as illustrated in FIG. 25, a first insulating film 12a is formed on a semiconductor substrate 11. The first insulating film 12a is formed with via-holes which is filled with a copper wiring layer 44 with a diffusion-barrier film 17 being sandwiched between an inner surface of each of the via-holes and the copper wiring layer 44. A second insulating film 12b is formed on the first insulating film 12a. The second insulating film 12b is also formed with recesses and via-holes which is filled with a copper wiring (not illustrated) with a diffusion-barrier film 17 being sandwiched between inner surfaces of the recesses and the via-holes, and the copper wiring.

Thus, recesses and/or holes formed throughout each of multi-layered insulating films are covered with the diffusion-barrier film 17, and then, the recesses and/or holes may be filled with a copper wiring layer.

Figure 26:
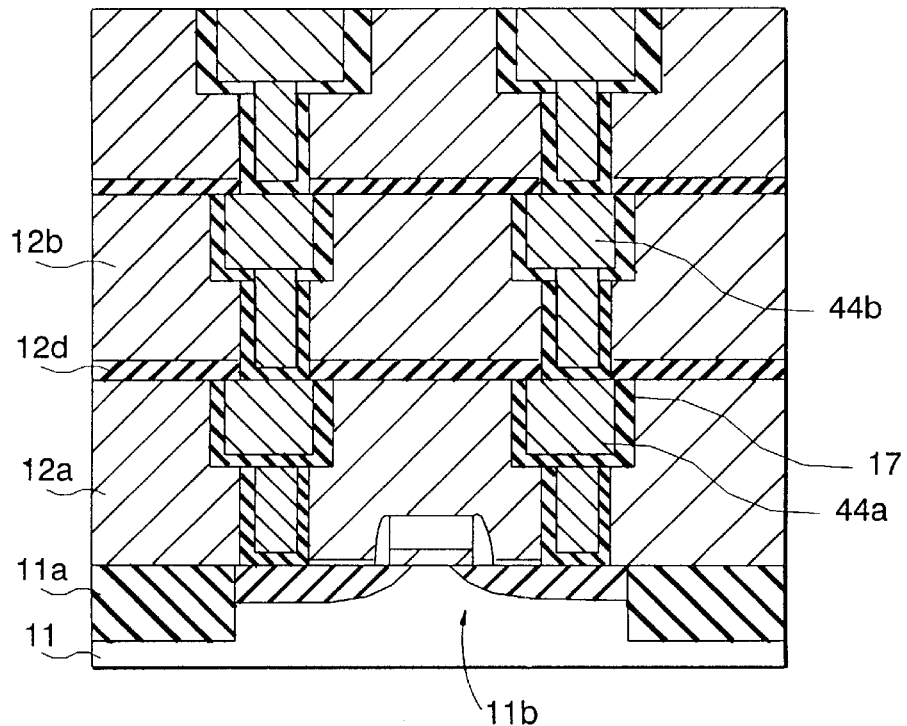
FIG. 26 is a cross-sectional view of a diffusion-barrier film covering a recess formed at a surface of an insulating film formed above lower wiring layers.

An example of the multi-layered structure is illustrated in FIG. 26. The illustrated multi-layered structure is comprised of three insulating layers. Each of the insulating layers is formed with recesses and via-holes, which are covered at their surfaces with a diffusion-barrier layer 17, and filled with copper wiring layers 44a and 44b.

Hereinbelow is explained a method of fabricating the multi-layered structure illustrated in FIG. 26.

A semiconductor substrate 11 is formed at a surface thereof with oxide layers 11a. A semiconductor device 11b is formed on the semiconductor substrate 11 between the oxide layers 11a.

A first insulating film 12a is formed on the semiconductor substrate 11. The first insulating film 12a is comprised of, for instance, a silicon dioxide film. The first insulating film 12a is formed with recess and holes reaching the semiconductor device 11b. The recesses and holes are covered at their inner surfaces with the diffusion-barrier film 17. The diffusion-barrier film 17 has a multi-layered structure comprised of a crystalline nitrogen-containing metal film and an amorphous metal nitride film, and has sufficient coverage to cover recesses and holes therewith. The diffusion-barrier film 17 may be formed by such high-pressure RF magnetron sputtering as mentioned in the first example.

Then, the recesses and holes are filled with copper in vacuum. Then, the copper film and the diffusion-barrier film 17 are removed by CMP until the first insulating film 12a appears. Thus, there is fabricated the copper wiring layer 44a.

Since copper does not form passive state at a surface, the copper wiring layer 44a may be oxidized. In order to prevent oxidation of the copper wiring layer 44a, a silicon nitride film 12d is formed over the first insulating film 12a.

Then, a second insulating film 12b is formed on the first insulating film 12a. The second insulating film 12b is formed with recesses and holes reaching the copper wiring layer 44a formed in the first insulating film 12a. Then, the recesses and holes formed in the second insulating film 12b are covered with the diffusion-barrier film 17, and the recesses and holes are filled with the copper wiring layer 44b. By repeating the above-mentioned steps by the desired number, there can be fabricated a semiconductor device having such a multi-layered copper wiring structure as illustrated in FIG. 26.

SIXTH EXAMPLE

The sixth example relates to an apparatus and a method of successively forming both a diffusion-barrier film having a multi-layered structure and copper wiring layer.

Figure 27:
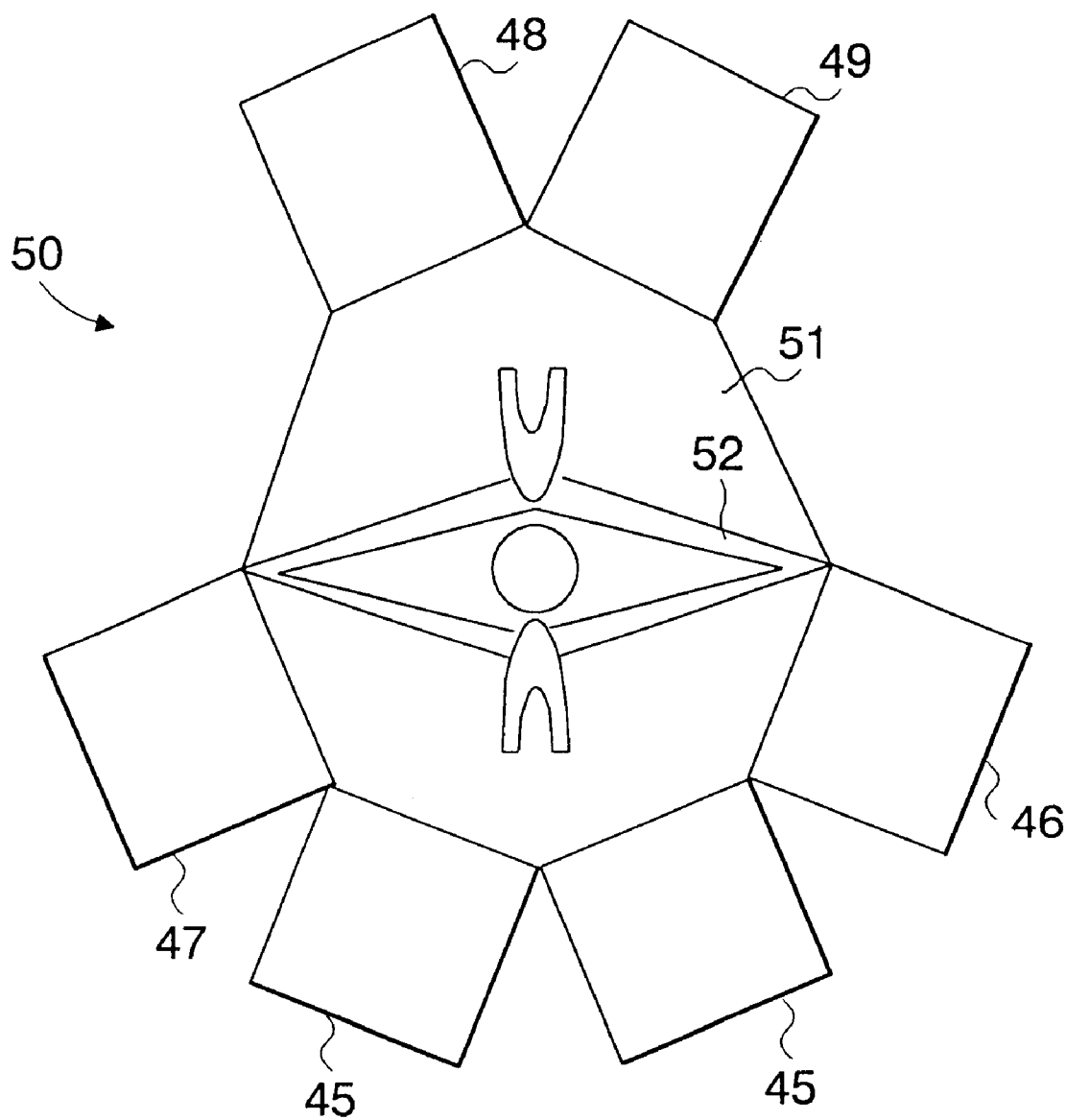
FIG. 27 is a plan view of a cluster apparatus used for forming a copper wiring layer.

FIG. 27 is a top plan view of an apparatus of forming a copper wiring layer, in accordance with the sixth example.

The apparatus includes a cluster chamber 51 including a separation chamber 51 at a center. The separation chamber 51 is equipped therein with a robot 52 for transferring a semiconductor substrate.

The cluster chamber 51 is comprised further of two lord lock chambers 45, a chamber 46 used for heating a semiconductor substrate, an etching chamber 47 used for cleaning recesses and holes, a sputter chamber 48 used for fabricating a diffusion-barrier film, and a chamber 49 used for forming a copper wiring layer, arranged around the separation chamber 51.

It is possible to form a copper wiring layer without exposure of a semiconductor substrate to atmosphere through the use of the cluster chamber 50.

Hereinbelow are explained steps of fabricating a copper wiring layer.

First, a semiconductor substrate is introduced into one of the lord lock chambers 45. An insulating film is formed in advance on the semiconductor substrate, and the insulating film is formed in advance with a recess and/or hole.

Then, the lord lock chamber 45 is evacuated of air by means of a dry pump and a turbo pump for about five minutes. As a result, the lord lock chamber 45 has a vacuum degree of $7 \times 10^{-3}$ Pa to $8 \times 10^{-3}$ Pa.

Then, a gate valve between the lord lock chamber 45 and the separation chamber 51 is made open. The separation chamber 51 is in advance kept in a vacuum degree of about $5 \times 10^{-5}$ Pa to $1 \times 10^{-5}$ Pa by means of a dry pump and a turbo pump. Hence, the semiconductor substrate is transferred into the separation chamber 52 by the robot 52 without being exposed to atmosphere.

Then, the semiconductor substrate is transferred into the chamber 46 which is in advance kept in a vacuum degree of about $6 \times 10^{31\ 5}$ Pa by means of a dry pump and a turbo pump. The semiconductor substrate is heated at about 50 to about 200 degrees centigrade in the chamber 46 to thereby remove moisture existing at a surface of the semiconductor substrate and clean a surface of the semiconductor substrate.

Then, the semiconductor substrate is transferred into the etching chamber 47 from the chamber 46 through the separation chamber 51. The etching chamber 47 is kept in a vacuum degree of about $5 \times 10^{-6}$ Pa by means of a cryosorption pump, dry pump and a turbo pump.

After introducing the semiconductor substrate into the etching chamber 47, the semiconductor substrate is plasma-etched in argon gas or argon gas diluted with hydrogen gas ($H_2$/Ar=3%). By carrying out plasma-etching, a surface of the semiconductor substrate and inner surfaces of a recess and a hole are reduced and cleaned.

The plasma-etching has an advantage that edges of a recess and a hole are ground by the plasma-etching, and accordingly, an opening area of the recess and hole is broadened, ensuring enhancement in coverage characteristic.

Then, the semiconductor substrate is transferred into the sputter chamber 48 from the etching chamber 47 by means of the robot 52. The sputter chamber 48 is kept in a vacuum degree of about $4 \times 10^{-6}$ Pa by means of a cryosorption pump, dry pump and a turbo pump. The high-pressure RF magnetron sputtering as having been explained in the first example is carried out in the sputter chamber 48.

In the sputter chamber 48, a crystalline nitrogen-containing metal film (a film composed of crystalline β-Ta and crystalline $TaN_{0.1}$ in mixture) and an amorphous metal nitride film (a $Ta_2N$ film) are deposited on the semiconductor substrate by the method having been explained in the first and second examples, wherein RF power is instantaneously switched. In this example, a gas pressure is kept at 10 Pa, a substrate temperature is kept at 200 degrees centigrade, a $N_2$ gas ratio is kept at 2%, and RF power is switched from 2 kW to 8 kW. As a result, there is obtained a diffusion-barrier film having a multi-layered structure and also having enhanced coverage characteristic under the characteristics illustrated in FIG. 6.

Then, the semiconductor substrate is transferred in vacuum to the chamber 49 from the sputter chamber 48. The chamber 49 is kept in a vacuum degree of about $4 \times 10^{-4}$ Pa by means of a dry pump and a turbo pump. Since the semiconductor substrate is transferred in vacuum, the crystalline nitrogen-containing metal film in the diffusion-barrier film is kept clean at a surface thereof. A copper film is deposited on the crystalline nitrogen-containing metal film by chemical vapor deposition (CVD) such that the recess and hole is filled with copper, as follows.

The semiconductor substrate is kept at about 170 to about 200 degrees centigrade. A source including Cu (hfac) tmvs (trimethylvinylsilyl hexafluoroacetylacetonate copper (I)) as a main constituent is introduced into a carburetor at 1 to 2 grams per minute through a liquid transfer system. The source gasified in the carburetor is introduced into the chamber 49 together with nitrogen carrier gas, resulting in that the chamber 49 is kept at about 1 kPa.

The gas introduced into the chamber 49 makes chemical reaction on the semiconductor substrate, and is turned into copper, and then, deposited on the semiconductor substrate. Herein, copper is deposited by such a thickness that a recess and/or hole is sufficiently filled with copper, for instance, a thickness in the range of about 8000 angstroms to about 15000 angstroms.

In particular, when a copper film is formed by CVD, segregation of fluorine at a surface of the diffusion-barrier film, diffusion of fluorine into the diffusion-barrier film, and diffusion of copper into the diffusion-barrier film exert a great influence on the adhesion, which fluorine is contained in Cu (hfac) tmvs which is a source for carrying out CVD.

Figure 28:
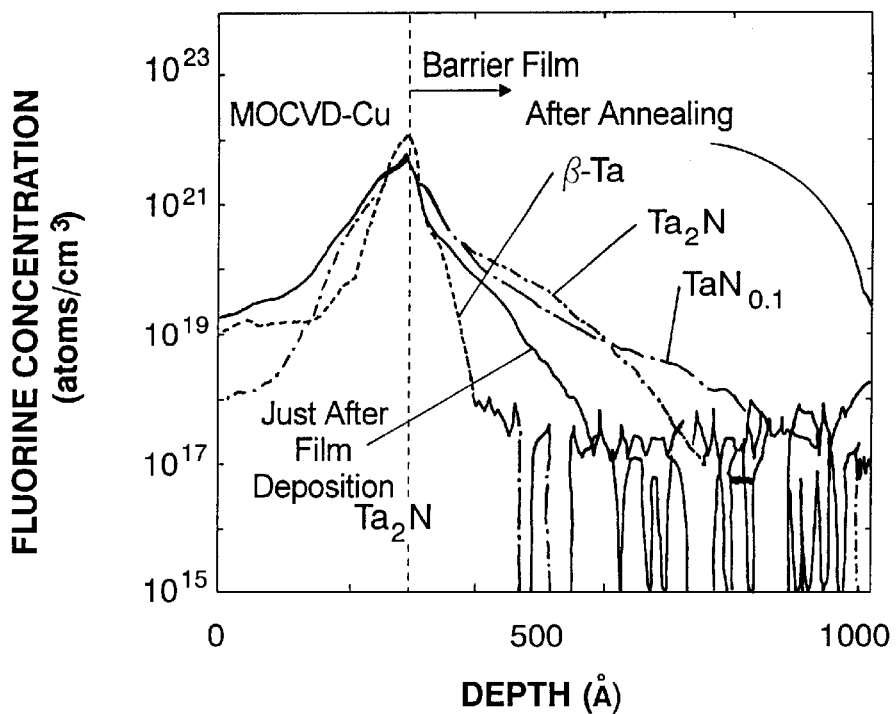
FIG. 28 is a graph showing a diffusion profile of fluorine into a diffusion-barrier film.
Figure 29:
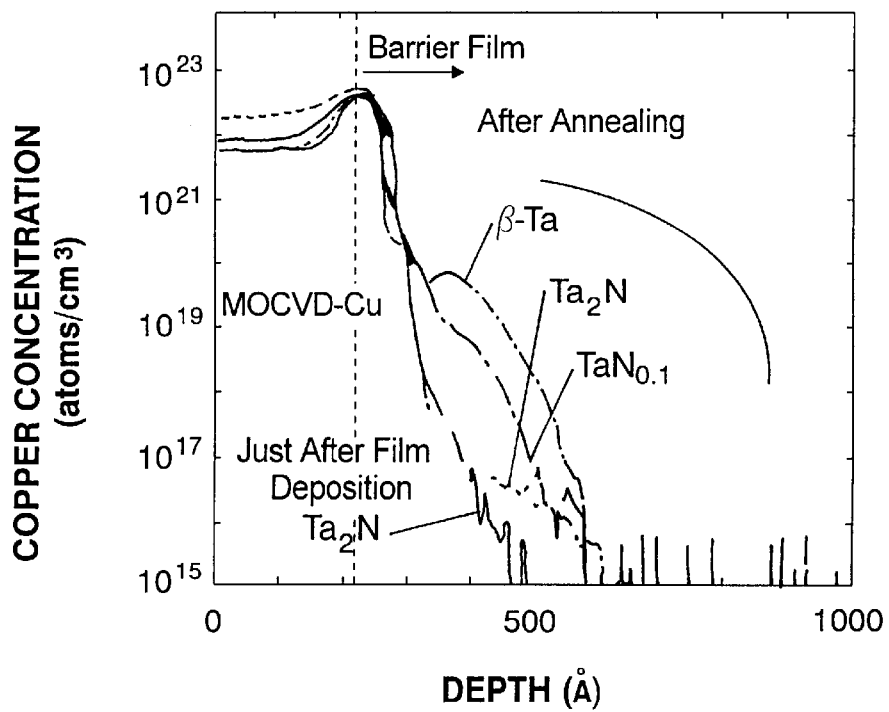
FIG. 29 is a graph showing a diffusion profile of copper into a diffusion-barrier film.

FIGS. 28 and 29 illustrate diffusion profiles of fluorine and copper into the diffusion-barrier film, respectively, which profiles were measured by SIMS (secondary ion mass spectroscopy).

In a β-Ta film obtained by sputtering carried out in argon atmosphere, since fluorine segregates at an interface between copper and tantalum, the β-Ta film would have poor adhesion. With respect to a $Ta_2N$ film, though fluorine is diffused into the $Ta_2N$ film, copper is scarcely diffused in the $Ta_2N$ film. As a result, atomics are coupled with each other with a poor force, and hence, the $Ta_2N$ film would have poor adhesion. In contrast, with respect to a $TaN_{0.1}$ film, since copper and fluorine are allowed to be diffused into the $TaN_{0.1}$ film, atomics are coupled with each other with a strong force, and as a result, the $TaN_{0.1}$ film would high adhesion.

Thus, it is understood that if copper is deposited by CVD, the diffusion-barrier film having a multi-layered structure comprised of a crystalline $TaN_{0.1}$ film and an amorphous $Ta_2N$ film would have enhanced adhesion and barrier characteristic of preventing copper diffusion.

In accordance with the sixth example, a copper wiring layer can be formed on a semiconductor substrate without the semiconductor substrate being exposed to atmosphere. Accordingly, the diffusion-barrier film is kept clean at a surface, and hence, film quality of a copper film formed by CVD is likely to be reflected to a crystalline structure of a tantalum film of the diffusion-barrier film. Thus, it is possible to enhance crystal orientation of copper and adhesion between copper and a diffusion-barrier film.

SEVENTH EXAMPLE

The seventh example relates to the cluster chamber 50 illustrated in FIG. 27. In the seventh example, the sputter chamber 48 is positioned in a region where a copper wiring layer is to be formed, which region corresponds to the chamber 49 in which a copper wiring layer is formed. Since the diffusion-barrier film includes a $TaN_{0.1}$ film containing crystalline β-Ta therein, at a surface, adhesion between the diffusion-barrier film and a copper film formed by sputtering is kept the same as adhesion between the diffusion-barrier film and a copper film formed by CVD.

EIGHTH EXAMPLE

Figure 30:
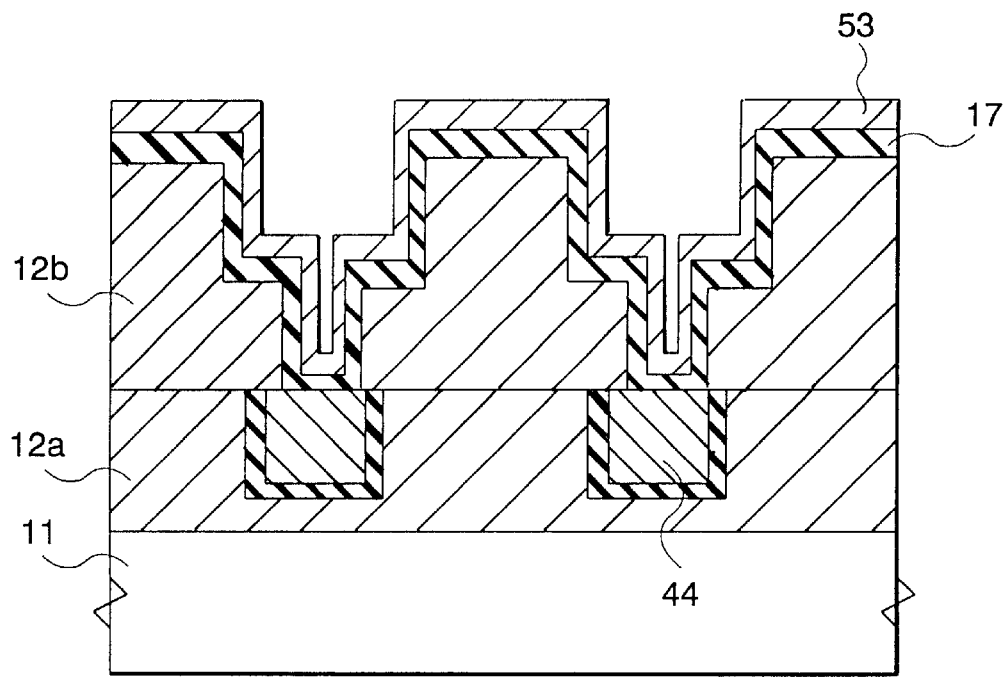
FIG. 30 is a cross-sectional view of a copper wiring structure in accordance with the seventh embodiment.

In the eighth example, the semiconductor substrate is taken out of the cluster chamber 50 illustrated in FIG. 27. The semiconductor substrate has such a copper wiring structure as illustrated in FIG. 30. Specifically, recesses and holes formed in the second insulating film 12b are covered with the diffusion-barrier film 17, and a copper film 53 is formed covering the diffusion-barrier film 17 therewith.

Figure 31:
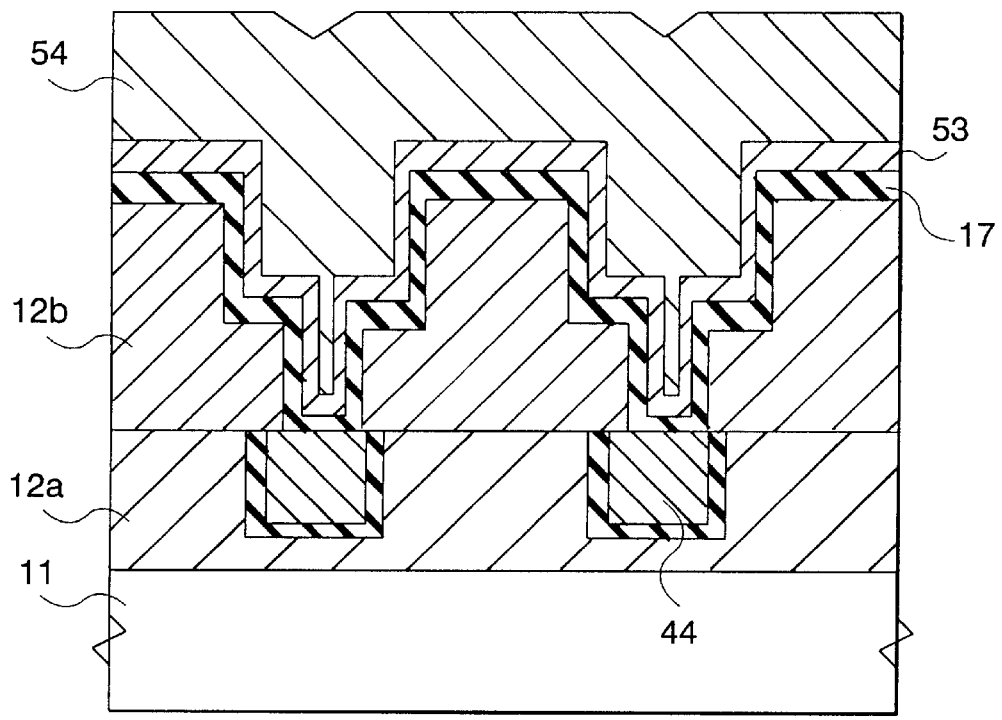
FIG. 31 is a cross-sectional view of a copper wiring structure in accordance with the seventh embodiment.

A second copper film 54 is deposited over the copper film 53 by plating such that the recesses and holes are filled with the second copper film 54. As a result, as illustrated in FIG. 31, it is possible to fabricate a structure comprised of the multi-layered barrier layer 17, the copper film 53 formed by CVD or sputtering, and the second copper film 54 formed by plating. Thereafter, as illustrated in FIG. 4D, for instance, the second copper film 54, the copper film 53 and the diffusion-barrier film 17 are removed by CMP. Thus, there is obtained a copper wiring structure.

While the present invention has been described in connection with the preferred embodiments, the present invention provides the following advantages.

The first advantage is that it is possible to have a diffusion-barrier film having sufficient barrier characteristic of preventing copper diffusion and high adhesion with a copper film. This is because the diffusion-barrier film is designed to have a multi-layered structure comprised of an amorphous metal nitride film having a high barrier characteristic of preventing copper diffusion and a crystalline nitrogen-containing metal film having high adhesion with copper.

The second advantage is that it is possible to successively fabricate the diffusion-barrier film in a common chamber. This ensures reduction in apparatus cost and reduction in time for fabricating the diffusion-barrier film.

This is because that it is possible to successively form an amorphous metal nitride film and a crystalline nitrogen-containing metal film by instantaneously changing only RF power with a volume ratio of a nitrogen gas to a process gas introduced into a chamber, being kept constant. In accordance with this method, an upper metal film in the diffusion-barrier film inevitably contains nitrogen therein.

The third advantage is that a copper film can be formed with a surface of the diffusion-barrier film being kept clean, through the use of an apparatus of transferring a semiconductor substrate in vacuum. As a result, reliability in a copper wiring layer can be enhanced.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 11-214110 filed on Jun. 24, 1999 including specification, claims, drawings and summary is incorporated herein by reference in its entirety.

What is claimed is:

1. A barrier film preventing diffusion of copper from a copper wiring layer formed on a semiconductor substrate, comprising a multi-layered structure of first and second films, said first film being composed of crystalline metal containing nitrogen therein, said second film being composed of amorphous metal nitride, said barrier film being constituted of common metal atomic species, said first film being formed on said second film, said first film in direct contact with said second film, said first film containing nitrogen in a smaller content than that of said second film.

2. The barrier film as set forth in claim 1, wherein said second film has a thickness in the range of 80 angstroms to 150 angstroms both inclusive.

3. The barrier film as set forth in claim 1, wherein said first film has a thickness in the range of 60 angstroms to 300 angstroms both inclusive.

4. The barrier film as set forth in claim 1, wherein said first film is composed of $\beta$-Ta and $TaN_{0.1}$, and said second film is composed of $Ta_2N$.

5. A multi-layered wiring structure comprising a barrier film which prevents diffusion of copper from a copper wiring layer formed on a semiconductor substrate, said barrier film having a multi-layered structure of first and second films, said first film being composed of crystalline metal containing nitrogen therein, said second film being composed of amorphous metal nitride, said barrier film being constituted of common metal atomic species, said first film being formed on said second film, said first film in direct contact with said second film, said first film containing nitrogen in a smaller content than that of said second film.

6. The multi-layered wiring structure as set forth in claim 5, wherein said second film has a thickness in the range of 80 angstroms to 150 angstroms both inclusive.

7. The multi-layered wiring structure as set forth in claim 5, wherein said first film has a thickness in the range of 60 angstroms to 300 angstroms both inclusive.

8. The multi-layered wiring structure as set forth in claim 5, wherein said barrier film covers a recess and a hole formed throughout an insulating film formed on an underlying wiring layer.

9. The multi-layered wiring structure as set forth in claim 5, further comprising a copper film formed on said first film.

10. The multi-layered wiring structure as set forth in claim 5, wherein said first film is composed of $\beta$-Ta and $TaN_{0.1}$, and said second film is composed of $Ta_2N$.

* * * * *